US008896909B2

(12) United States Patent
Sandström et al.

(10) Patent No.: US 8,896,909 B2
(45) Date of Patent: Nov. 25, 2014

(54) METHOD AND DEVICE SCANNING A TWO-DIMENSIONAL BRUSH THROUGH AN ACOUSTO-OPTIC DEFLECTOR (AOD) HAVING AN EXTENDED FIELD IN A SCANNING DIRECTION

(75) Inventors: Torbjörn Sandström, Pixbo (SE); Hans Martinsson, Gothenburg (SE)

(73) Assignee: Micronic AB, Taby (SE)

( * ) Notice: Subject to any disclaimer, the term of this patent is extended or adjusted under 35 U.S.C. 154(b) by 186 days.

(21) Appl. No.: 13/288,915

(22) Filed: Nov. 3, 2011

(65) Prior Publication Data

US 2012/0281271 A1 Nov. 8, 2012

Related U.S. Application Data

(60) Provisional application No. 61/410,331, filed on Nov. 4, 2010, provisional application No. 61/410,332, filed on Nov. 4, 2010, provisional application No. 61/410,333, filed on Nov. 4, 2010.

(51) Int. Cl.
*G02F 1/33* (2006.01)
*G03F 7/20* (2006.01)

(52) U.S. Cl.
CPC .............. *G02F 1/33* (2013.01); *G03F 7/7005* (2013.01); *G03F 7/70291* (2013.01); *G03F 7/70358* (2013.01)
USPC ....................................................... 359/305

(58) Field of Classification Search
USPC ....................................................... 359/305
See application file for complete search history.

(56) References Cited

U.S. PATENT DOCUMENTS

| 3,727,062 | A | 4/1973 | Foster |
| 3,744,039 | A | 7/1973 | Watson et al. |
| 4,992,858 | A * | 2/1991 | Kobayashi .................... 348/196 |
| 7,483,196 | B2 | 1/2009 | Allen et al. |
| 7,826,130 | B2 | 11/2010 | Schweitzer et al. |
| 8,269,137 | B2 | 9/2012 | Ehrmann et al. |
| 2009/0073544 | A1 | 3/2009 | Schweitzer et al. |

FOREIGN PATENT DOCUMENTS

EP 1324105 A2 7/2003

OTHER PUBLICATIONS

Hinkov, et al., "Feasibility of optical CDMA using spectral encoding by acoustically tunable optical filters", Electronics Letters, IEE Stevenage, GB, vol. 31, No. 5, Mar. 2, 1995, pp. 384-386.
International Search Report of corresponding PCT Application No. PCT/EP2011/069420, mailed Feb. 24, 2012, pp. 1-4.
International Preliminary Report on Patentability of corresponding PCT Application No. PCT/EP2011/069420, completed Jan. 24, 2013, pp. 1-9.
Written Opinion of the International Searching Authority of corresponding PCT Application No. PCT/EP2011/069420, completed May 4, 2013, pp. 1-5.

* cited by examiner

*Primary Examiner* — James Jones
(74) *Attorney, Agent, or Firm* — Haynes Beffel & Wolfeld LLP; Ernest J. Beffel, Jr.

(57) ABSTRACT

The technology disclosed relates to improved acousto-optic deflectors (AODs). In particular, it relates to compensation for subtle effects not previously addressed by AOD designers. A shifting center of gravity is described and addressed using advanced power equalisation strategies. Denser writing brushes are provided by using a two-dimensional array of beams with corrections for factors such as angle of incidence at the AOD interface. The compensation and dense brush features can be used separately or in combination.

7 Claims, 26 Drawing Sheets

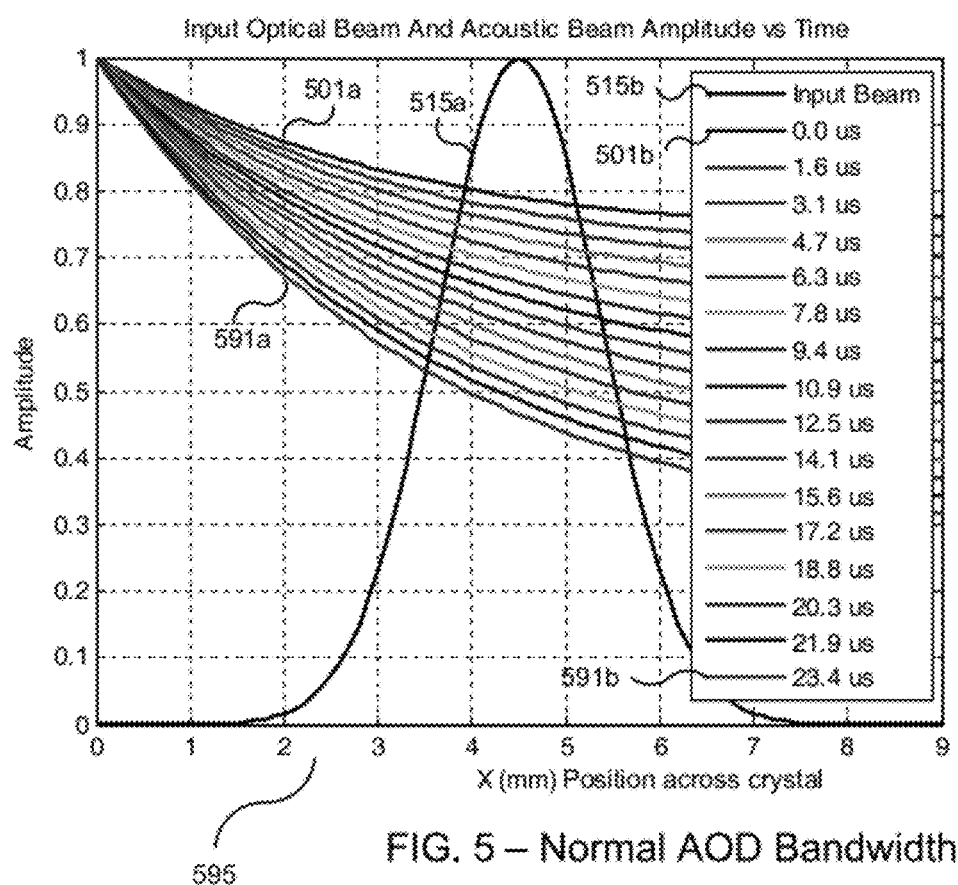
FIG. 5 – Normal AOD Bandwidth

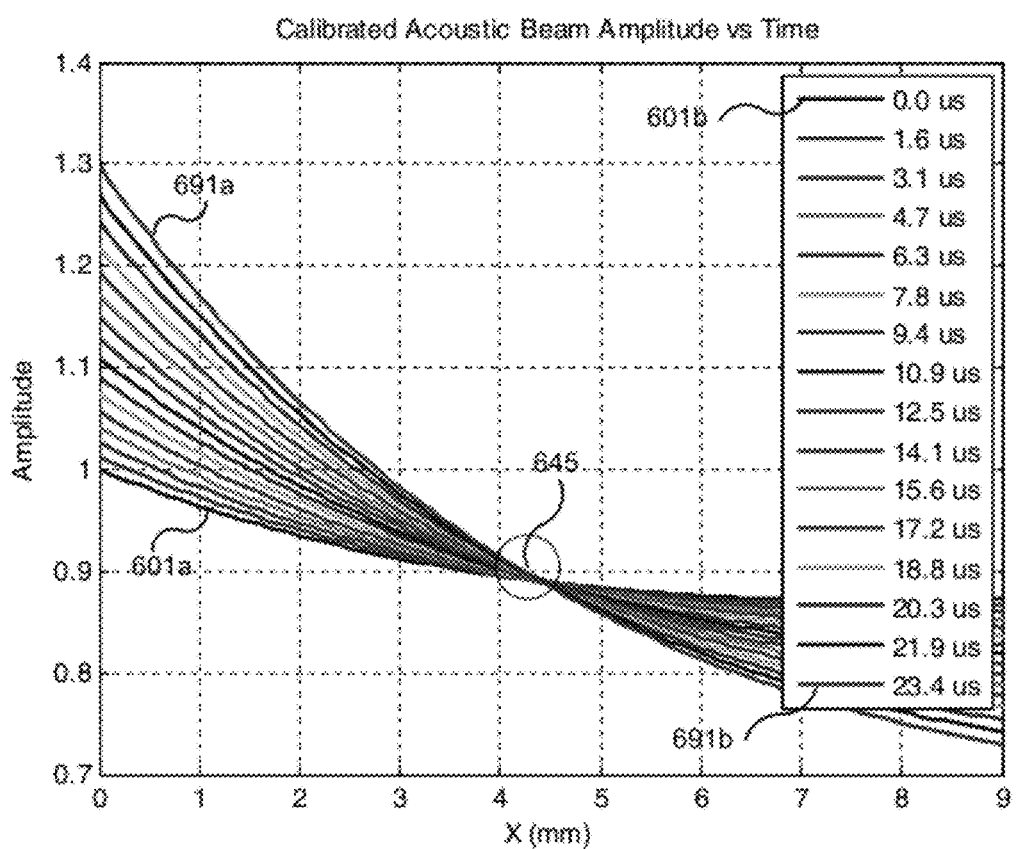
FIG. 6 – Total Power Equalisation
Prior Art

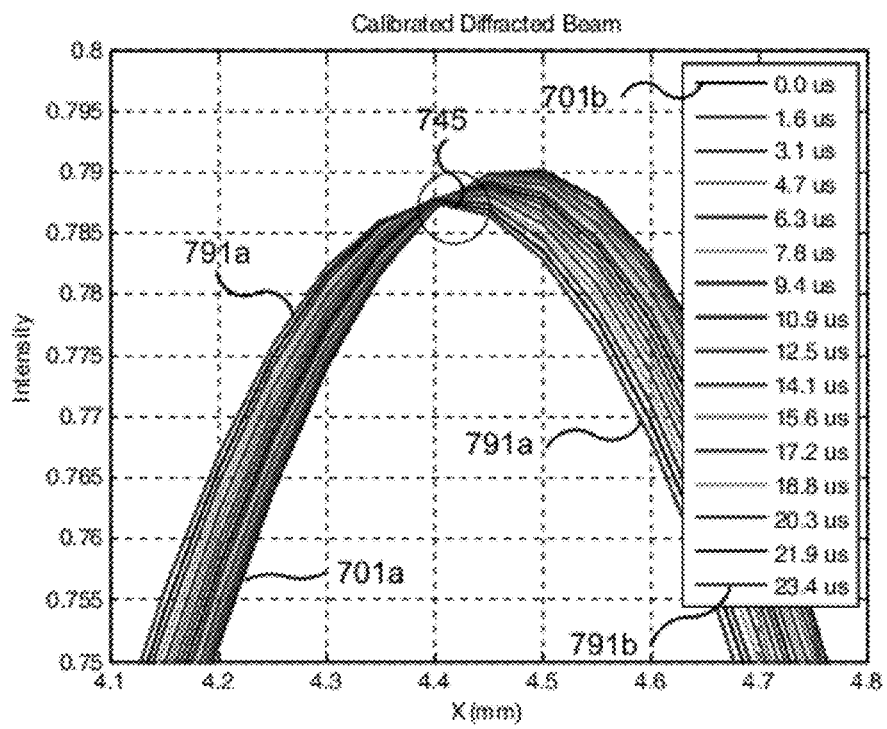
FIG. 7a – Total Power Equalisation
Prior Art
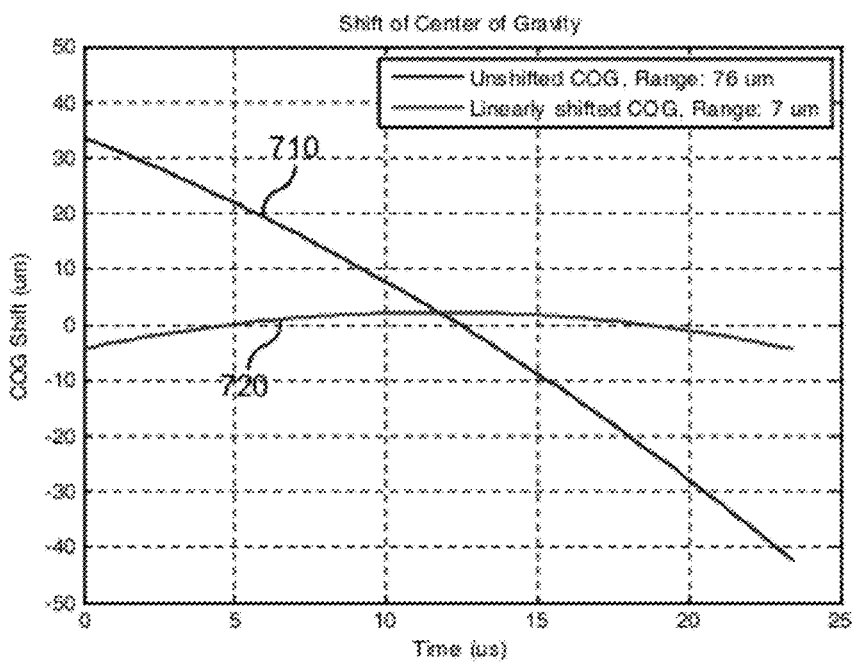
FIG. 7b – Comparing Approaches

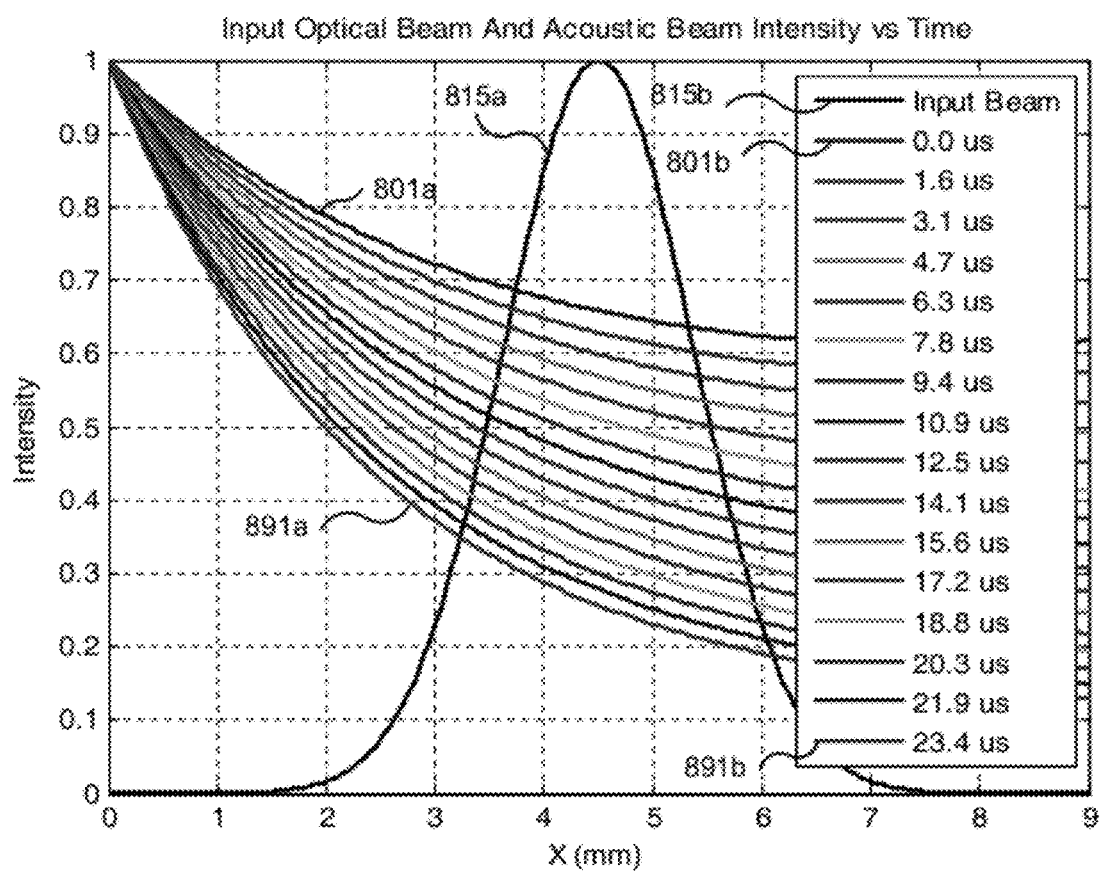
FIG. 8 – Extended AOD Bandwidth

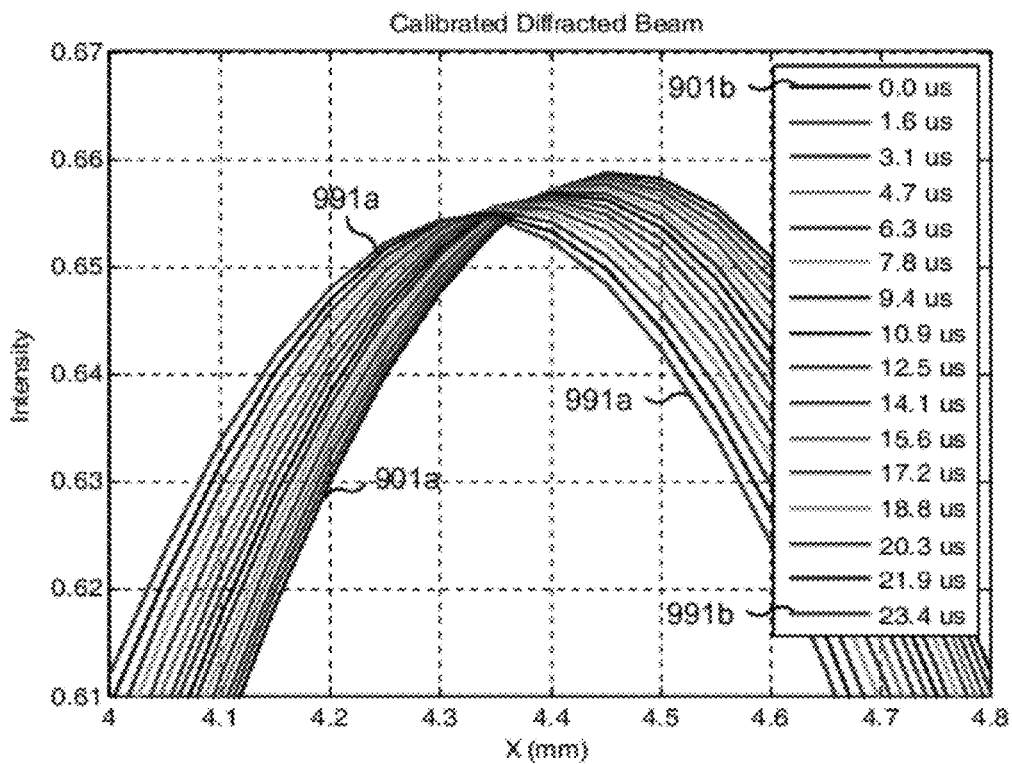
FIG. 9a – Extended AOD Bandwidth
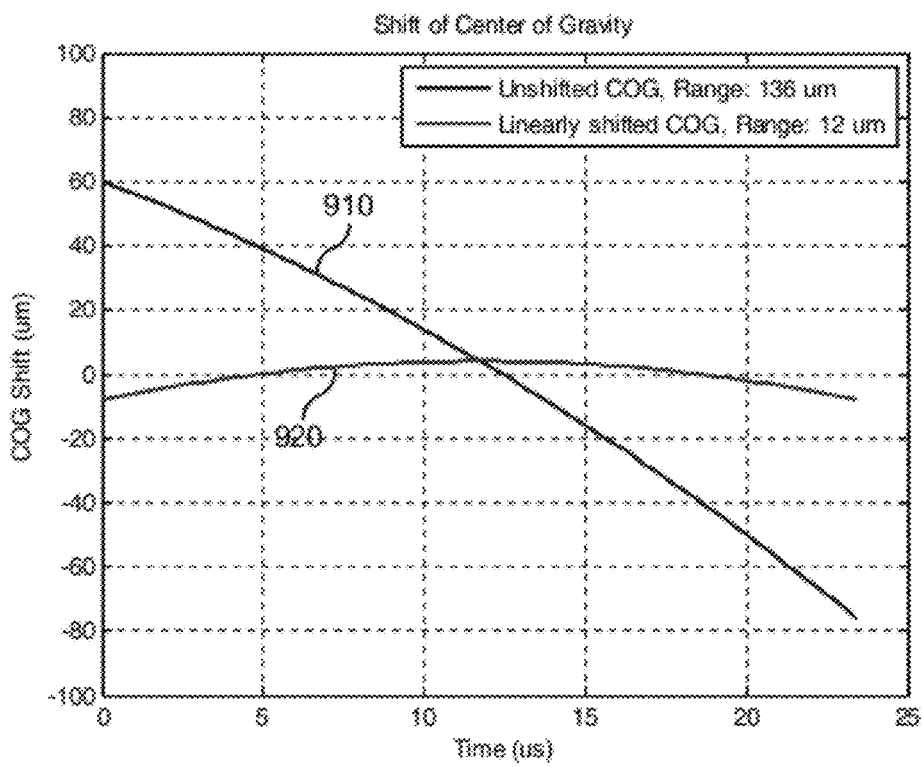
FIG. 9b

Advanced Correction for Acoustic Attenuation
– Constant Profile Base Power Envelope Correction for Incident Angle
Of Sub-brushes A and B in Combined Brush Prior Art – Constant Base Equalisation

US 8,896,909 B2

METHOD AND DEVICE SCANNING A TWO-DIMENSIONAL BRUSH THROUGH AN ACOUSTO-OPTIC DEFLECTOR (AOD) HAVING AN EXTENDED FIELD IN A SCANNING DIRECTION

RELATED APPLICATIONS

This application is related to and claims the benefit of three U.S. Provisional Patent Applications filed on Nov. 4, 2010. It claims the benefit of U.S. Prov. App. No. 61/410,331, entitled "Method and Device Having Increased Bandwidth in an Acousto-Optic Deflector," by Torbjörn Sandström. It further claims the benefit of U.S. Prov. App. No. 61/410,332, entitled, "Method and Device Having a Two Dimensional Brush in an Acousto-Optic Deflector Having an Extended Field in a Scanning Direction," by Torbjörn Sandström and Hans Martinsson. It also claims the benefit of U.S. Prov. App. No. 61/410,333, entitled "Method and Device Having a Complex Two Dimensional Brush Formed with Non-Interfering Sub-Brushes," by Torbjörn Sandström. These provisional applications are incorporated herein by reference.

BACKGROUND

The technology disclosed relates to improved acousto-optic deflectors (AODs). In particular, it relates to compensation for subtle effects not previously addressed by AOD designers. A shifting center of gravity is described and addressed using advanced power equalisation strategies. Denser writing brushes are provided by using a two-dimensional array of beams with corrections for factors such as angle of incidence at the AOD interface.

An acousto-optic deflector is driven by an induced ultrasonic acoustic wave through a crystal, such as a TeO2 crystal. Typically, this wave is a so-called chirp or sawtooth wave. The chirp has a bandwidth, which is the difference between the minimum and maximum frequency. The maximum range of deflection from the AOD corresponds to this bandwidth. The scan frequency corresponds to the period of the chirp. The shorter the chirp, the more frequently the deflector scans a beam through its range of deflection.

SUMMARY

The technology disclosed relates to improved acousto-optic deflectors (AODs). In particular, it relates to compensation for subtle effects not previously addressed by AOD designers. A shifting center of gravity is described and addressed using advanced power equalisation strategies, with improved telecentricity. Denser writing brushes are provided by using a two-dimensional array of beams with corrections for factors such as angle of incidence at the AOD interface. Faster or higher precision writing can be achieved using a denser brush. Particular aspects of the present invention are described in the claims, specification and drawings. The compensation and dense brush features can be used separately or in combination.

BRIEF DESCRIPTION OF THE DRAWINGS

FIG. 1: A generic multibeam scanning system in which the invention can be used.

FIG. 5: The cross-section of the beam and the effect of the frequency-dependent acoustic attenuation in an example AOD driven with constant power.

FIG. 6: The acoustic intensity across the crystal after the RF has been adjusted to give constant diffraction efficiency at 4.4 mm.

FIG. 7a: How the beam appears to shift during the scan.

FIG. 7b: The shift of the center of gravity with previously used RF calibration and with the invention applied to an example AOD.

FIG. 8: Same as FIG. 5 but with a different example AOD having a larger frequency span.

FIGS. 9a-9b: Same as FIGS. 7a-7b but with an example AOD having a larger frequency span.

FIG. 10b shows one example.

DETAILED DESCRIPTION

Figure 1A:
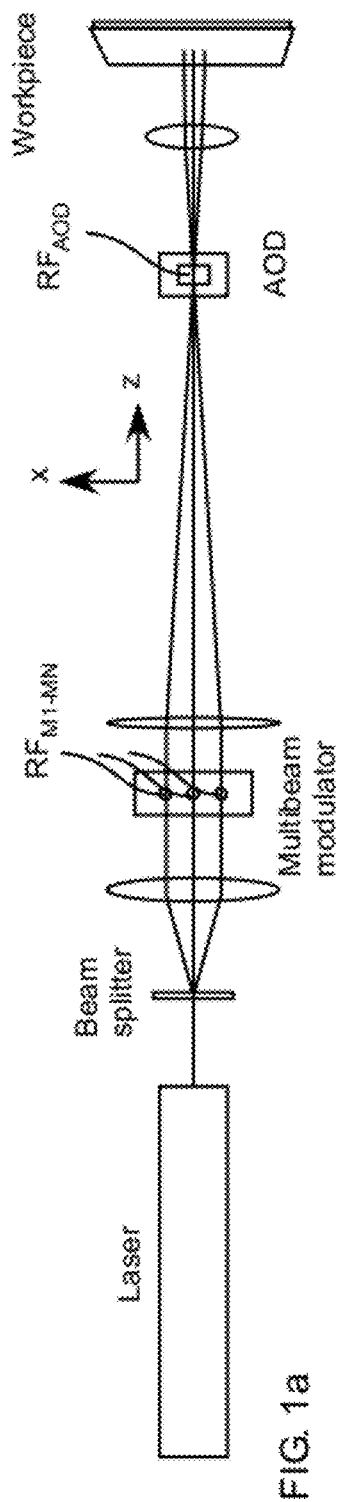
FIGS. 1a and 1b show two views as indicated by the coordinate systems.
Figure 1B:
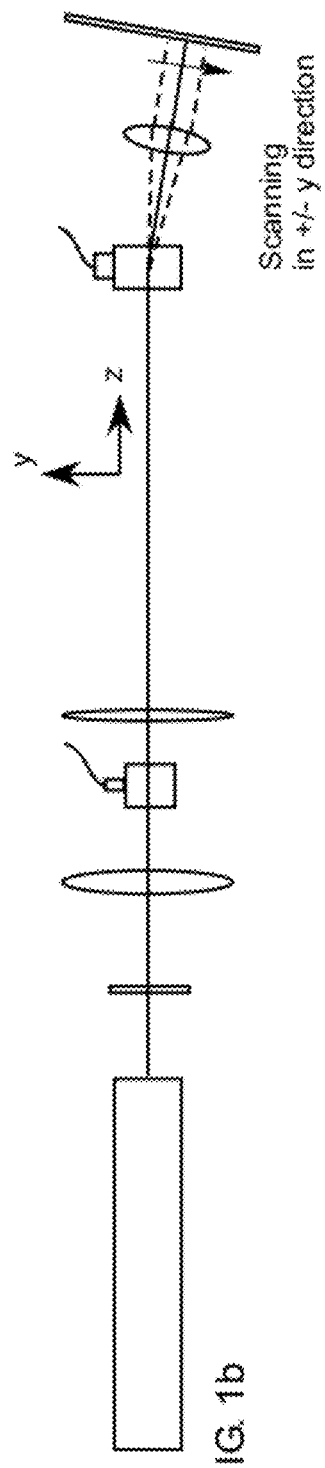
Figure 2:
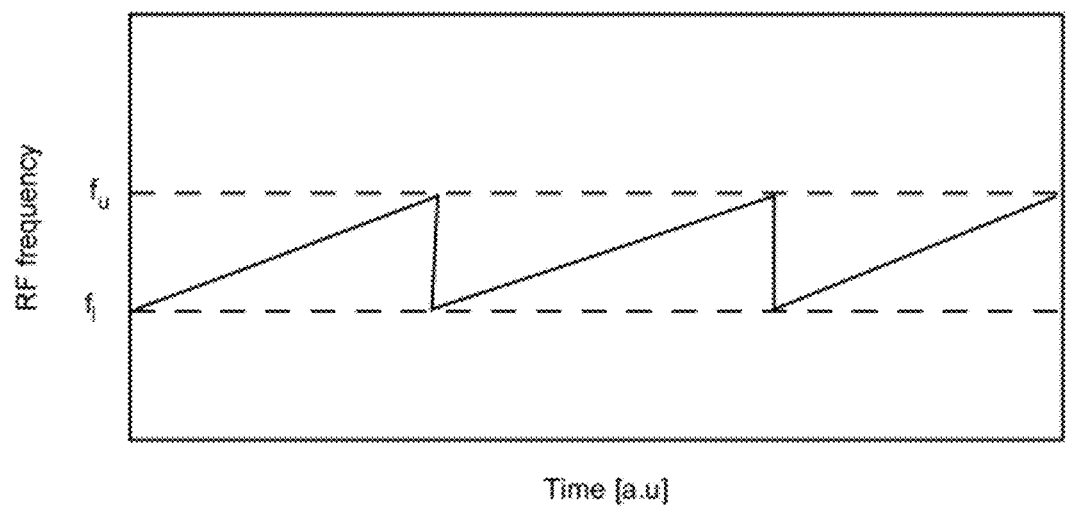
FIG. 2: A chirped RF signal fed to the AOD in a system like that in FIG. 1.

The following detailed description is made with reference to the figures.

Preferred embodiments are described to illustrate the present invention, not to limit its scope, which is defined by the claims. Those of ordinary skill in the art will recognize a variety of equivalent variations on the description that follows.

Advanced AOD Control with Power Modulation

The technology disclosed uses power modulation, in a writing system with a single acousto-optic deflector (AOD) that scans multiple beams, to correct for certain errors related to the physical principles of the AOD.

Also disclosed are methods and devices having a two-dimensional brush in an acousto-optic deflector having an extended field in a scanning direction. A two-dimensional brush is enabled by compensation for varying angles of incidence between component beams of a sub-brush and an acousto-optic crystal. The disclosure that follows explains how the effectively available bandwidth of an AOD can be increased by reducing the detrimental effects of varying acoustic attenuation. In an AOD, the effectively available bandwidth for precise patterning depends in part on the handling of beam components that have differing angles of incidence to the AOD crystal. The technology disclosed introduces a compensation for the differing angles of incidence, applying a variety of alternative approaches. Compensating for the differing angles increases design flexibility by permitting more beam components to be combined in a single brush, despite increasing variation in incidence angle.

In AODs, acoustic attenuation at higher RF frequencies affects the deflected beams negatively. In addition, differential errors in a two-dimensional brush of beams result from variation in the angle of incidence between the individual brush beams and the surface of the AOD crystal.

We disclose applying time-varying corrections to both the AOD and power modulation. The technology disclosed can be defined locally in an AOD operating over a wide frequency span. Consider a set of beams coming into the AOD from a range of angles $\alpha$ spread in two directions $\eta$ and $\xi$, as depicted in FIG. 14$a$. This technology combines variation of the RF power used to drive the AOD and variation of the power of the beams. The beams may be modulated before or after the AOD, or even at the radiation source. This approach reduces telecentricity errors and power variations among beams across the scan. It stabilizes diffraction efficiency in the AOD across the scan and between the beams.

The reduction of telecentricity errors over the scan can be understood by consideration of the figures. FIG. 5 shows how attenuation varies with frequency. Multiple curves are shown for parts of the chirp that are at different frequencies. The lowest frequency with the chirp is at the first time, 0.0 μs. The highest frequency of the chirp is at the end of the chirp period, 23.4 μs. (In the discussion that follows, we often refer to the frequency of the chirp, instead of the time position in the chirp period, as frequency has a more intuitive relationship to the physical effects.)

Figure 3:
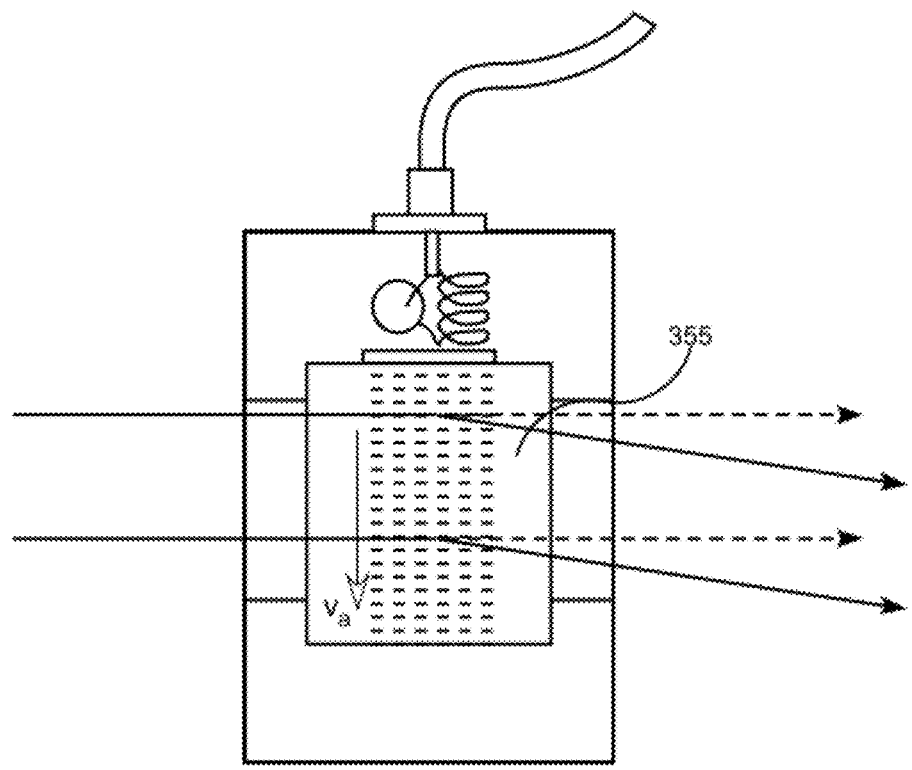
FIG. 3: An acousto-optic deflector with case, crystal, RF cable and RF-matching network. Va indicates the acoustic velocity and propagation direction of the acoustic wave.
Figure 4:
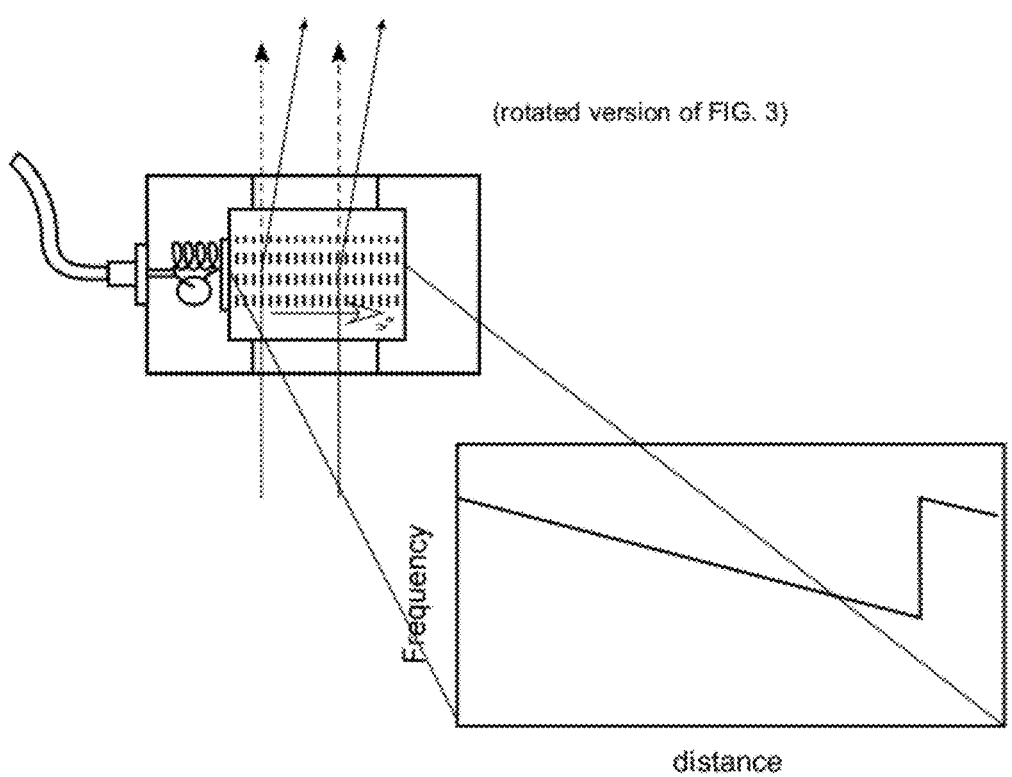
FIG. 4: Explains the coordinate system used in later figures. The diagram shows frequency vs. position at a point in time, and the position axis is the position along the direction of propagation of the acoustic wave.
Figure 10A:
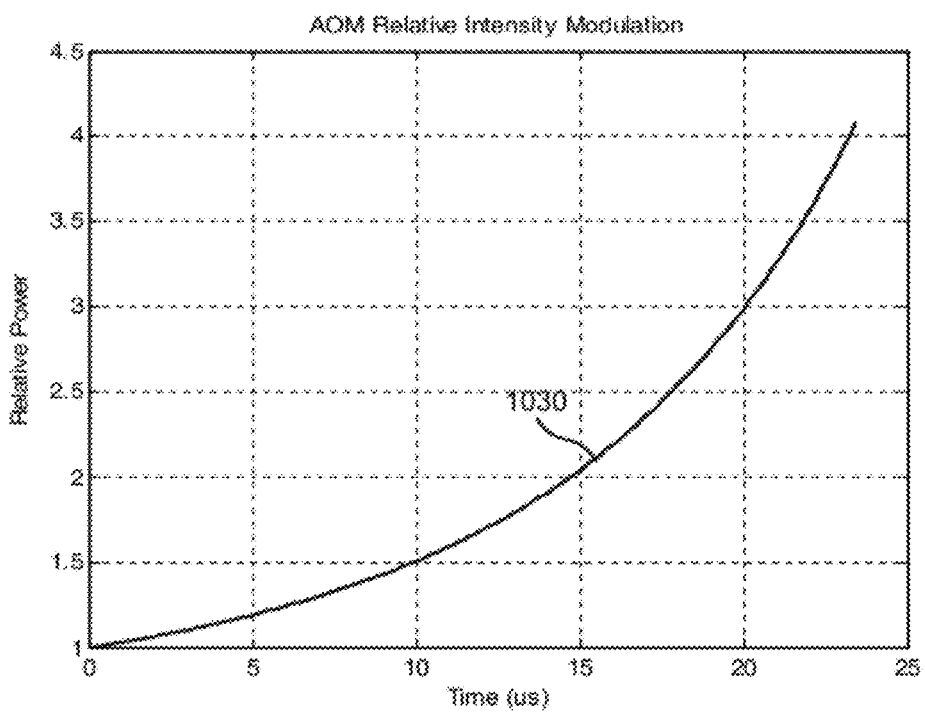
FIG. 10a: The power envelope to the modulator for an example embodiment.
Figure 10B:
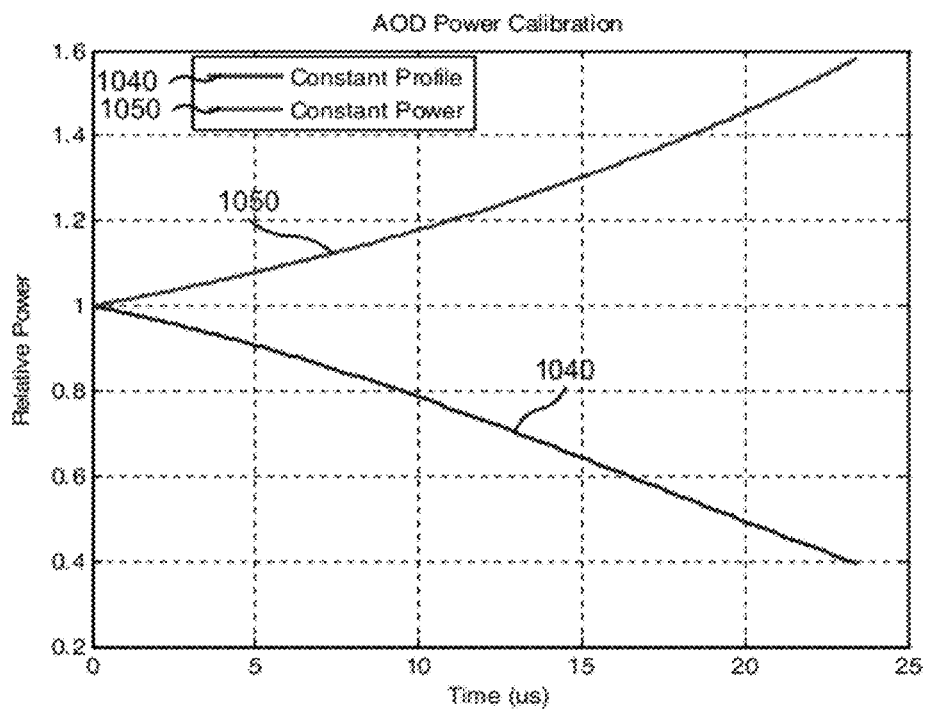
FIG. 10b: The calibrated power to the AOD to create constant power over the scan and constant profile. There are several possible functions that stabilize the power profile with different slopes.
Figure 10C:
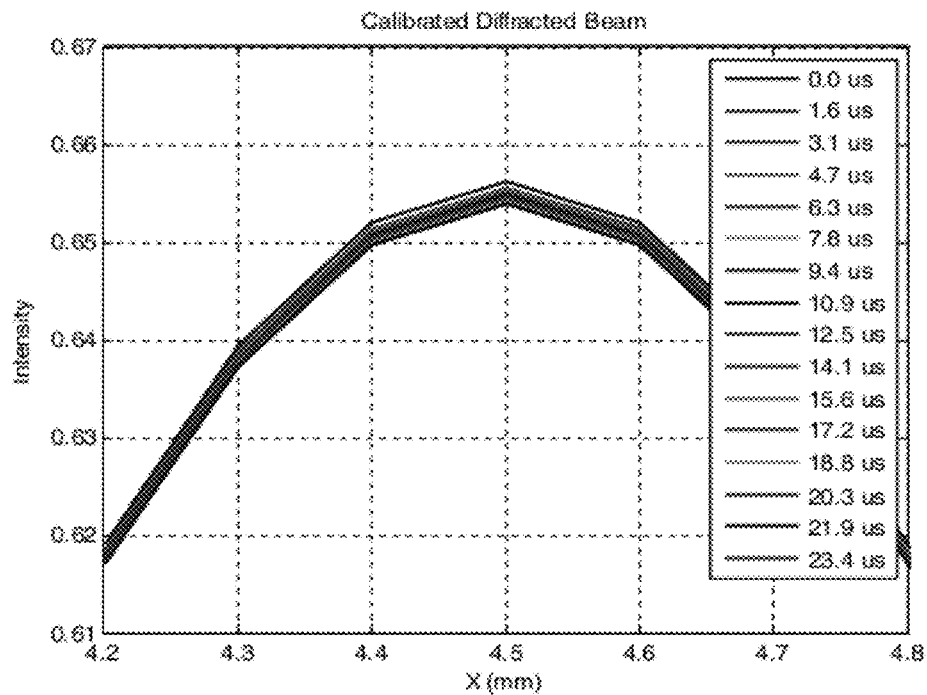
FIG. 10c: Illustrates how the center of gravity is aligned over time across the aperture of the AOD.
Figure 10D:
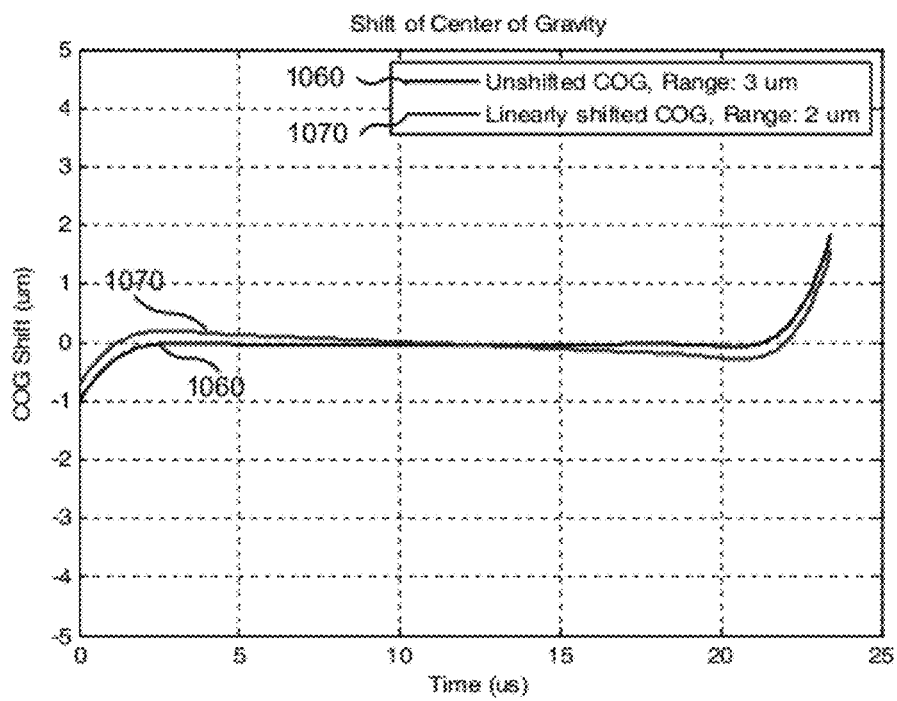
FIG. 10d: An example of reduced shift of the center of gravity with the constant profile approach disclosed herein.

In FIG. 5, the relative amplitude of the chirp diminishes as it travels 9 mm through the AOD crystal (355 in FIG. 3). For the lowest frequency 501$a$-$b$ of the chirp, the graph shows a relative amplitude attenuation from 1.0 to about 0.75. For the highest frequency of the chirp 591$a$-$b$, the attenuation across the crystal is from 1.0 to about 0.33. For reference, the Gaussian distribution of an input laser beam that is applied to the AOD is overlaid on the cross-section of the crystal 595. The highest intensity and energy density in the optical beam in 515$a$-$b$ is between 2 and 7 mm, centered at 4.5 mm.

In the past, a power equalisation has been applied over the period of the chirp signal. As depicted in FIG. 6, the power is equalized across frequencies as each of the frequencies crosses the middle of the crystal, at 4.4 mm. Only the total diffraction power is considered and not diffraction efficiency at varying frequencies of the chirp. This results in telecentricity error. As in FIG. 5, the low frequency 601$a$-$b$ and high frequency 691$a$-$b$ attenuation curves are labeled.

Recent design work to build an acousto-optic deflector with a higher bandwidth capability has led to concern about the telecentricity error. This error shifts the position of the apparent source of the beam when looking into the optics from the workpiece, and the shift varies with the frequency. It is desired in lithography to have the source appear to be stationary on the optical axis.

FIG. 7$a$ analyzes the combined effect of the Gaussian distribution of the input optical beam and the AOD effects. The X-scale spans 4.1 mm to 4.8 mm, instead of 0 to 9 mm. The individual graph lines indicate the shifted beam profile at different chirp frequencies, after applying power equalisation. The curves show that the power equalized at the highest frequency part of the chirp (at 23.4 μs, 791$a$-$b$) shifts the entire curve about 0.08 mm to the left of the curve for the lowest frequency part of the chirp (at 0.0 μs, 701$a$-$b$.) The cross-over 745 of the curves at 4.4 mm in this graph corresponds to the cross-over 645 in FIG. 6. at a magnified scale.

The curves in FIG. 7$a$ reveal a shifting of the center of gravity (COG) of the Gaussian input optical beam after diffraction. The superimposed curves of FIG. 7$a$ reflect power equalisation for total power. Again, this total power equalisation was intended to produce the cross-over of beam intensity curves 745 that is graphed at 4.4 mm, 0.7875 intensity. From the superimposed curves, it appears that the intensity apex is at different points that depend on the chirp frequency. The effect of total power equalisation on the center of gravity position is quantified in FIG. 7$b$, by the curve 710 that slopes downward from top left to bottom right. This curve shows a change in the COG over the range of frequencies of about 76 μm. This corresponds to a telecentricity error of about 25 mrad, some of which is removed during alignment and linear calibration. Telecentricity error in this context means that the landing angle between the beam and the surface of the workpiece, after the final lens of the writing system, changes during the scan. This creates a scan-length error if the workpiece is slightly shifted along the optical axis. With the advanced power equalization approach disclosed herein, the COG shift error is significantly reduced, as depicted by the nearly horizontal line 920.

Increasing the bandwidth used to drive an AOD increases the shift in the COG, when applying the total power equalisation approach. In FIG. 9$a$, the center of gravity shifts between about 4.27 mm and 4.44 mm. The curve 910 in FIG. 9$b$ shows a shift range of 136 μm, nearly twice the shift of 76 μm plotted for a narrower bandwidth. With the advanced power equalization approach disclosed herein, the COG shift error is significantly reduced, as depicted by the nearly horizontal line 720.

Figure 17:
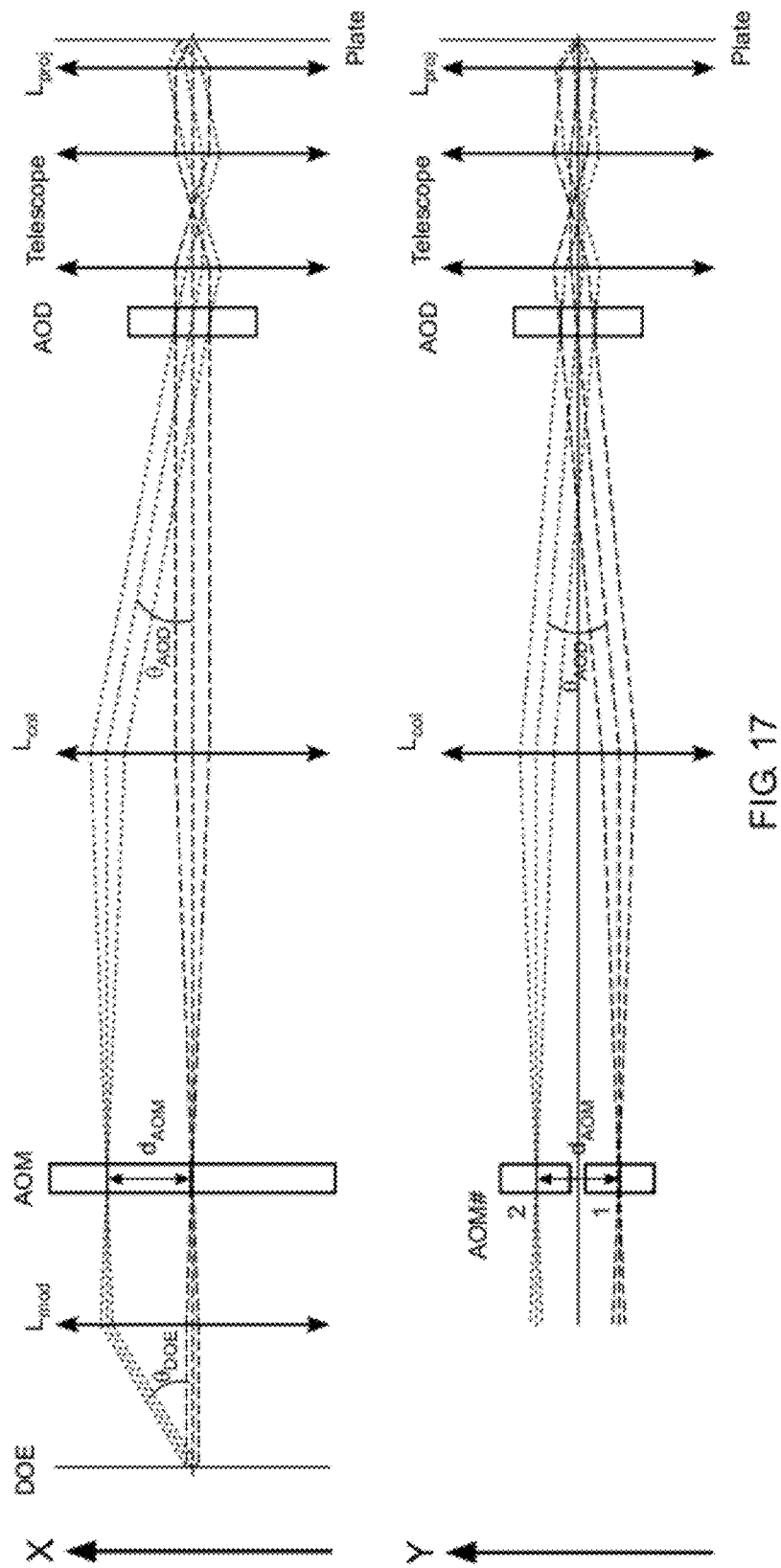
FIG. 17: A diagram of combining two AOMs.

A technology developed after recognizing the problems related to COG migration with chirp frequency is depicted in FIGS. 10$a$-$b$. This technology uses a modulator to control intensity of the input optical beam, combined with a modified AOD power calibration. This combination produces a much reduced drift of the COG across frequencies of the chirp. In FIG. 10$a$, relative intensity modulation of the input optical beam is graphed 1030 against chirp frequency over time. As frequency increases, diffractive efficiency decreases and so the base power of the beam in increased to compensate. As depicted in FIG. 10b, the relative power applied to the chirp that drives the AOD decreases with the frequency to maintain a constant profile 1040. This sharply contrasts with the relative power increase as the chirp frequency increases, to mainstain constant total power equalisation curve 1050 is used. This so-called constant profile equalisation combines with relative intensity modulation of the input optical beam to produce a diffraction of the beam that has a non- or minimally shifting center of gravity over the effective frequency range of the chirp that drives the AOD. FIG. 10c illustrates how the center of gravity is aligned over time across the aperture of the AOD. From time 0.0 µs to time 23.4 µs, the calculated distribution of intensity across the aperture is centered at approximately 4.5 mm. The disclosed constant profile equalisation replaces the shifting COG distribution as illustrated by FIGS. 7a and 9a with the non- or minimally shifted COG in FIG. 10c. Additional detail of the COG by time is shown in FIG. 10d. This figure resembles FIGS. 7b and 9b, but with a much different scale. The y axis in FIG. 10d ranges over +/−5 µm, which is a much narrower range than the +/−50 or 100 µm in the other figures. The unshifted COG 1060 is essentially flat from 3-22 µm. Tails at 0 and 23.4 µs can be compensated for to reduce the COG variation 1070, for instance by adjusting the distance between the AOD and telescope, as illustrated in FIG. 17.

Attenuation is frequency dependent. An acoustic power envelope can be used to produce a constant relative diffraction efficiency curve, as a deflection chirp passes through the AOD crystal. The absolute diffraction efficiency will then vary with time. Variation in the absolute diffraction efficiency can be compensated by varying the optical power of the incoming (or outgoing) laser beam. The incoming laser beam can pass through a modulator or be modulated at its source. A modulator can be micromechanical or electro-optical. A typical modulator is often an acousto-optic modulator. An analog or continuous transfer function represents how an input signal to the modulator relates to the modulated power of an output beam. By modifying the input, applying either a digital value or analog voltage or power, the desired compensation producing the desired absolute diffraction efficiency in the AOM can be accomplished.

The needed power modulation compensation curve can be calculated from a mathematical model of the AOD and modulator, but is more accurately determined empirically.

Useful results of combining modified acoustic driving of the AOD with compensating modified beam power are that the first-order drift of the COG can be removed and that the scanning beam still has constant power over the scan. The telecentricity or landing angle is thereby more constant for a given range of driving frequency. For a given tolerance of variation in the beam landing angle, the AOD can be driven with a wider frequency range, with a higher maximum frequency, which improves the length of the scan or alternatively makes faster scanning possible, both giving higher throughput.

Figure 11A:
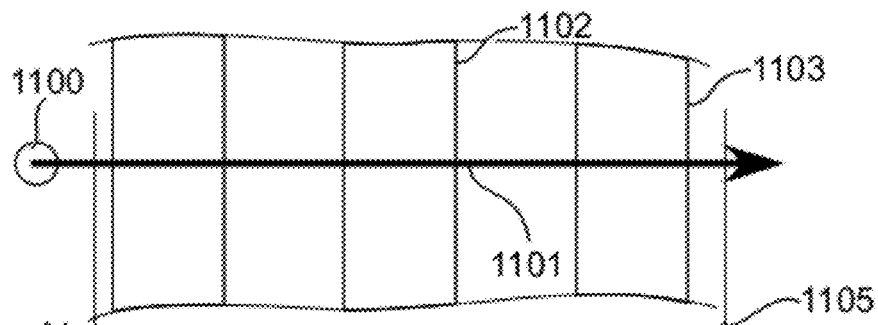
FIG. 11: How the modulator signal can be used.
Figure 11B:
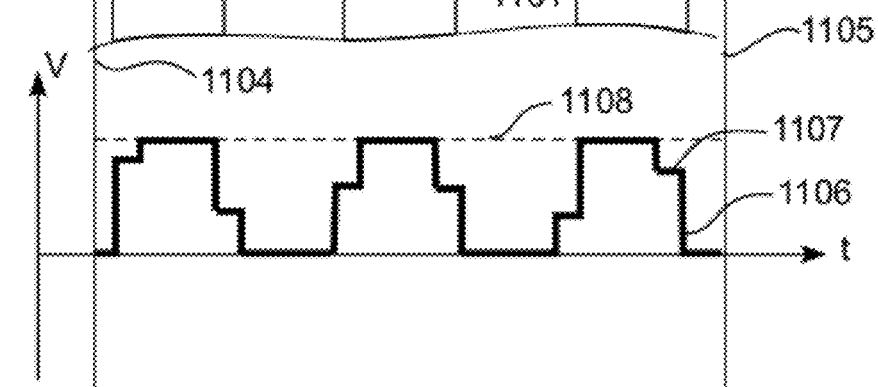
Figure 11C:
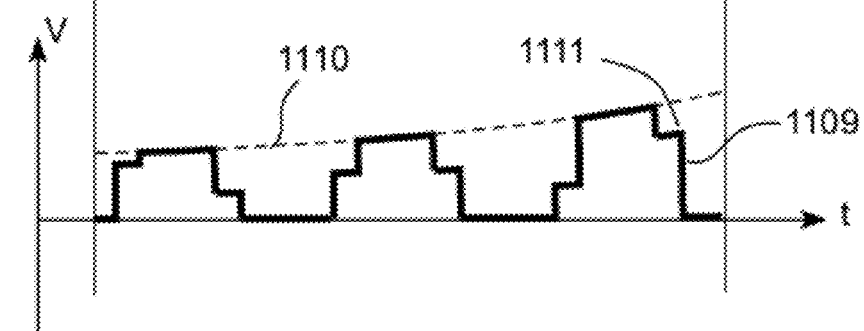

One way to combine beam power compensation with patterning data is by multiplication of the data with compensation prior to modulation. In some implementations, the pattern data includes a sequence of grayscale pixels (typically converted to analog voltage or current signals with 16 or more levels), which can be multiplied by a time-dependent envelope value, as illustrated by FIGS. 11a-c. In FIG. 11a, a single beam 1100 is scanning to write lines, e.g. 1102 and 1103. In previously known technology shown in FIG. 11b, the data consists of a consecutive set of pixels 1107, and to each pixel across the aperture 1104-1105 a modulator voltage V is assigned to represent the pattern along the scan line 1101. The voltage 1106, 1109 goes between 0 and 100% 1108, corresponding to 0 to 100% beam power.

Figure 13:
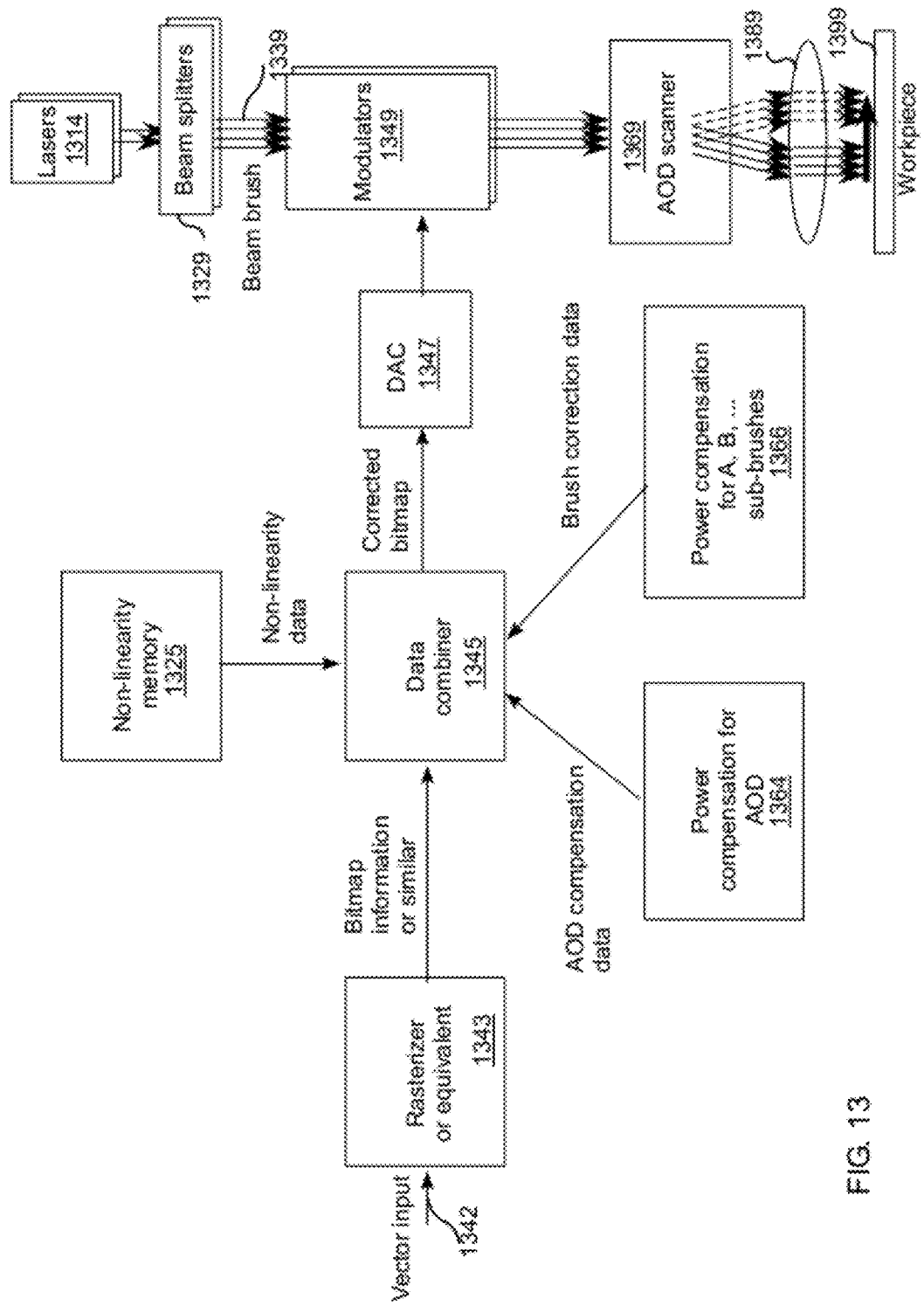
FIG. 13: Example flowchart for a system that can apply both types of correction taught in this application.

FIG. 11c illustrates how the modulation may be accomplished. The RF power applied to the AOD in this example is reduced with time, compared to what is required for constant diffraction efficiency. The diffraction efficiency is therefore falling with time and has to be compensated in the beam. FIG. 11c illustrates adjusting the beam power using a modulator. Data that drives modulation increases the beam power output from the modulator with time. The pixel values V on the vertical axis are conceptually the product 1109 of the rasterized data 1106 and a time-varying envelope function 1110. In reality, the modulator is non-linear and the pixel value 1111 has to be derived from the rasterized data 1107 and the envelope 1110 with knowledge about the non-linearity of the modulator. FIG. 13 shows an example embodiment of a system that can implement the correction in FIG. 11c.

A suitable procedure to adjust the two power variations follows. The acoustic attenuation is a material constant, such as 16 dB/(µs GHz^2*µs) for a shear-mode tellurium dioxide AOD at small off-axis angles. A model can be built, like the one used for the figures described, and a suitable level of correction can be set. Full compensation of the acoustic attenuation requires a high dynamic range in the modulator and low optical efficiency, so less than full compensation may be used. When the desired level of compensation has been determined, it is programmed into the modulator drivers (shown in FIG. 13). After that, the RF driving power for the AOD can be calibrated across the scan. Finally the power differences between the beams are measured and corrected by reprogramming of the modulator drivers.

Correcting for Diffraction Efficiency ("DE") vs. η Angle in a 2D Brush

Figure 14A:
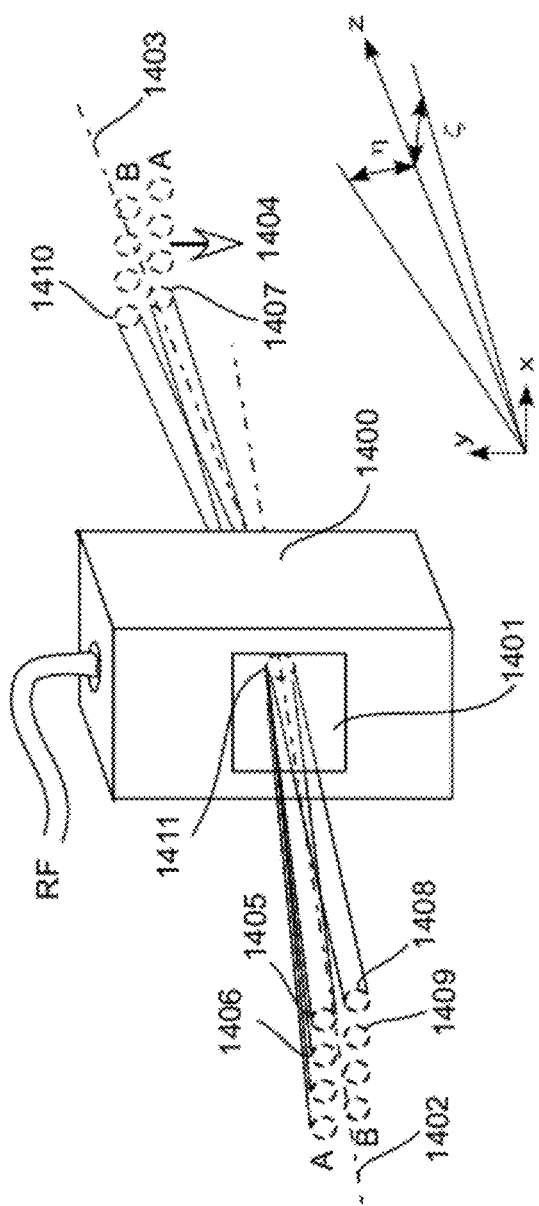
FIG. 14a: A deflector set up for multibeam scanning and definitions of the angles.
Figure 14B:
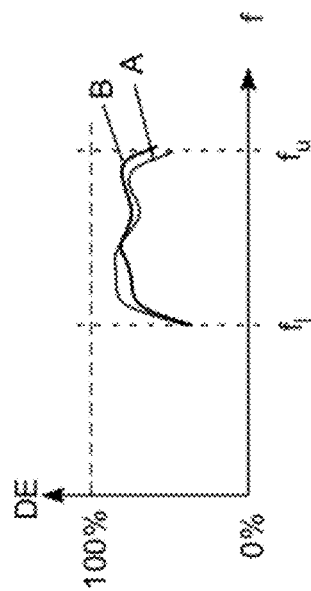
FIG. 14b: Example of diffraction curves for beams with different parameters.
Figure 19:
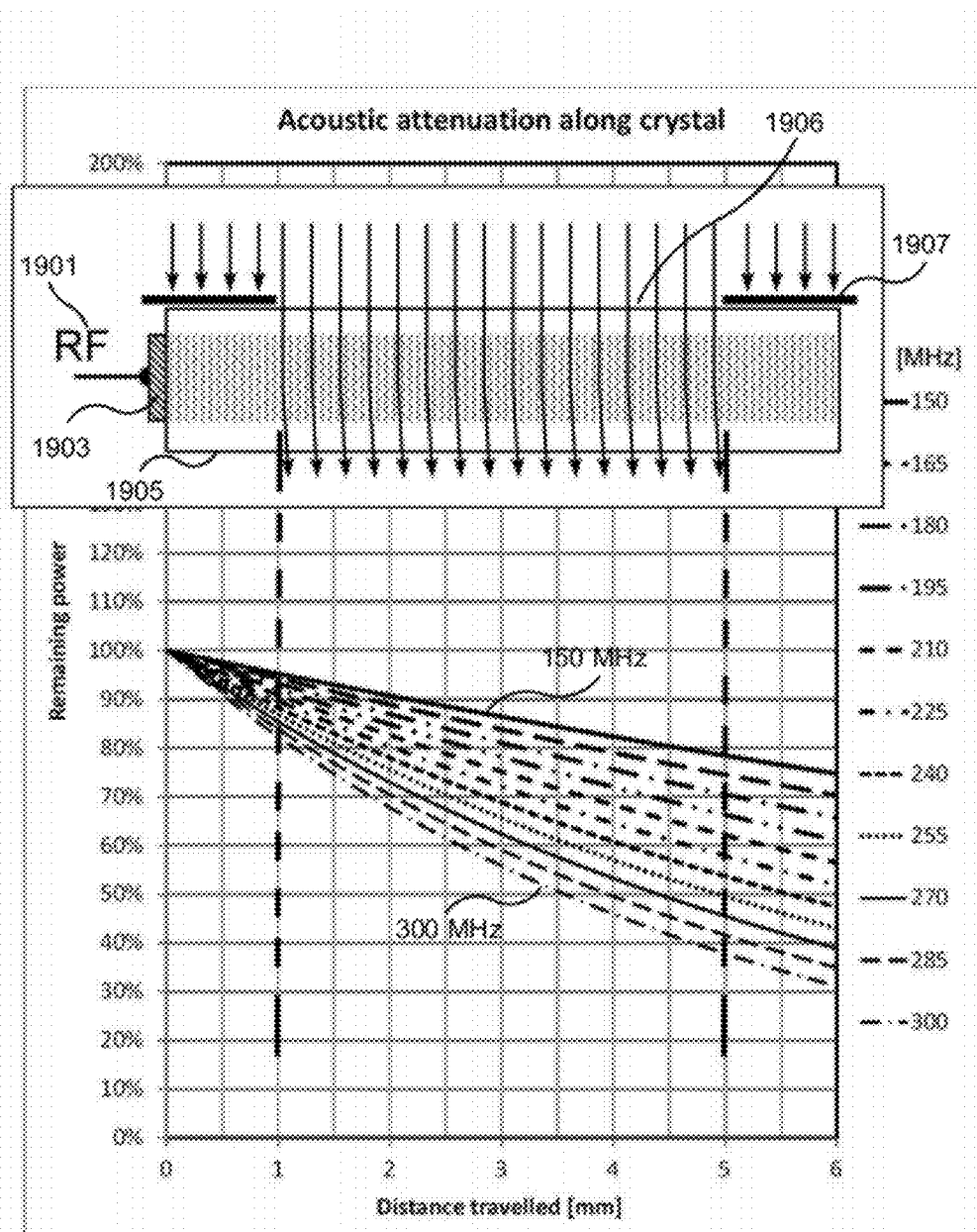
FIG. 19 depicts a simplified example acousto-optic deflector and shows the attenuation of the sound as sound with different frequencies travels through the crystal.

FIG. 14a illustrates an acousto-optic deflector 1400 having an interaction crystal 1401 driven by an RF signal, which is converted into a field of intense ultrasound waves that are not shown in this figure, but are represented in FIGS. 3 and 19. FIG. 14a shows that the AOD has an optical axis 1402 on the input side and a diffracted optical axis 1403 on the output side. The in and out axes usually are not parallel to each other. In the case of a single beam, the direction of the output beam depends on the frequency of the RF signal. By using a variable frequency, the beam can be made to scan in the η direction shown in the figure. It is known in the art to use a brush (sometimes called a rake) of beams 1405, 1406, 1408, 1409, etc., which enter the AOD under slightly different angles. The beams typically cross in the AOD so they enter with a span in angles. The beams in the brush cross each other at the AOD aperture 1411, normally inside the crystal, and exit as a similar collection of beams 1407, 1410, etc. When the frequency of the RF is changed, the direction of the output beams changes in the η direction, but the relative angles between the beams stay constant. The brush or rake makes a scanning movement as indicated by the arrow with a hollow head 1404.

In a scanning system intended to have the highest possible quality, it is useful if the beams in the rake are equal in power across the scan. Close analysis has shown that spreading the beams in the ξ direction is rather benign. Several beams can be distributed in ξ as shown by the group sub-brush "A" that includes spots 1405, 1406, 1407. Those beams remain closely similar distributed across the scan. See, e.g., 1407. The sensitivity to angular variation in the η direction has been found to be much higher, though. This is particularly true for deflectors using birefringent crystals to create high bandwidth. The diffraction efficiency "DE" versus frequency changes rapidly with the input angle η as illustrated by the pair of lines A-B in FIG. 14b. The diffraction efficiency, i.e. the power of the output beam at constant RF power, is a complex function of geometry, crystal properties, transducer resonances, and RF matching. The curve A for the sub-brush is shown by the narrow line in FIG. 14b. It is typically high enough to be useful between a lower frequency $f_l$ and an upper frequency $f_u$. The thick line B shows an example DE curve for a beam with a slightly different angle η.

Variation of the AOD RF power vs. frequency helps make the power of the diffracted beam constant vs. frequency. In a writing system it is useful for the power of the focused beams hitting the workpiece to be constant across the scan. As discussed above, using at least one beam modulator and varying the RF power to the AOD, second-order effects of the acoustic attenuation in the crystal can be minimized for one beam.

Figure 12A:
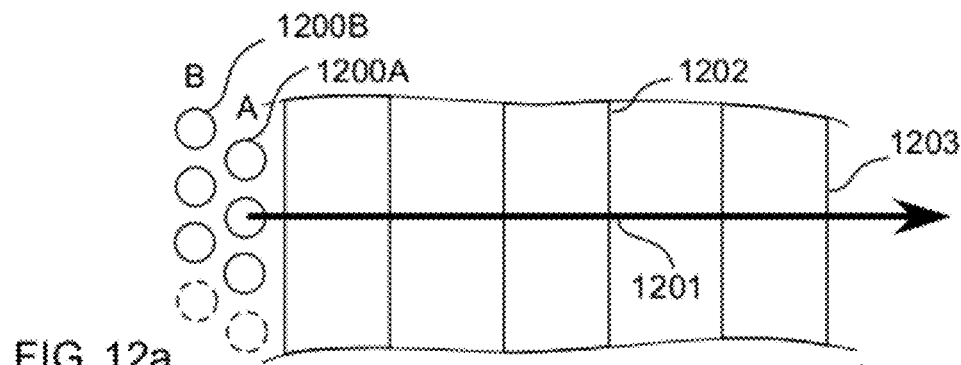
FIG. 12: How individual modulator signals are used to correct for beam-to-beam variations in the power.
Figure 12B:
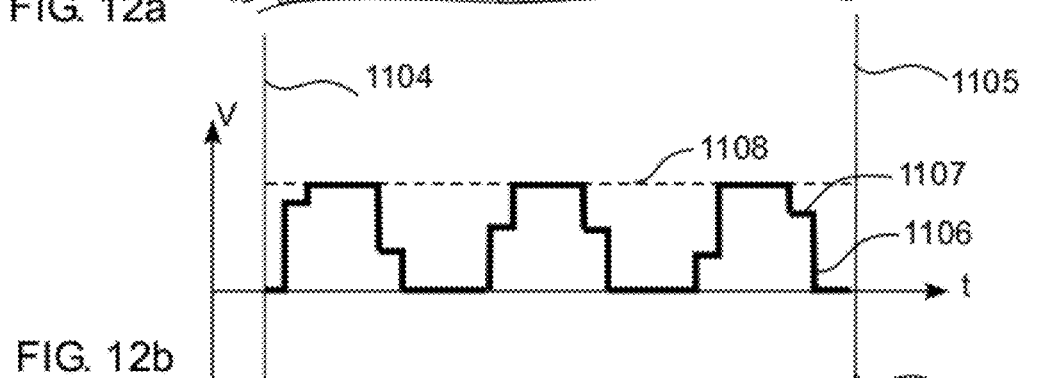
Figure 12C:
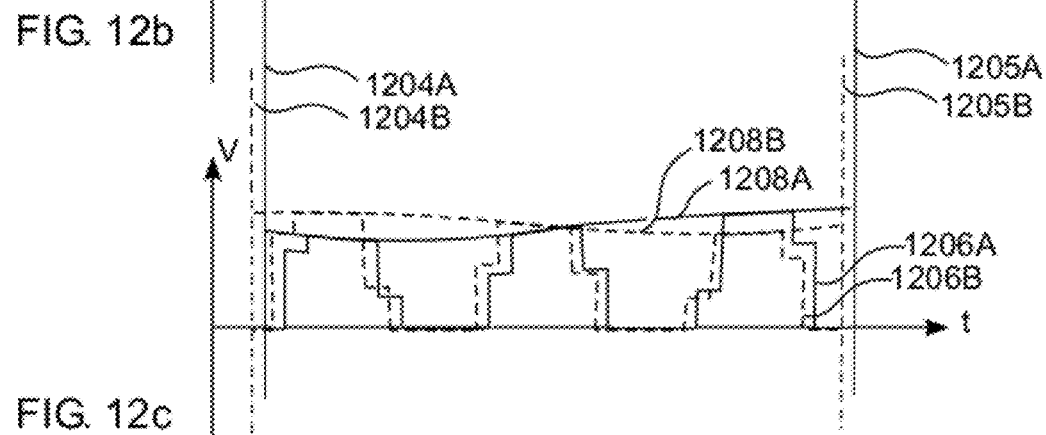

FIGS. 12a-c illustrate a two-dimensional the envelope function that corrects for varying incident angles of sub brushes A and B. Since the diffraction efficiency is different for different angles η, all beams cannot be perfectly equalized at the same time. We have found that the difference in diffraction efficiency can be corrected by changing the data, in particular by conceptually multiplying the data (typically grayscale data) by an envelope function, thereby correcting the difference in diffraction efficiency between the beams, typically between the sub-brushes A and B (1200A-B). FIG. 12a schematically depicts a two-dimensional brush having sub-brushes A and B scanning 1201 over a number of vertical lines 1202, 1203, etc. Features shared between FIGS. 11 and 12 retain the numbering assigned in FIG. 11. As in FIG. 11, the additional FIG. 12b illustrates the rasterized grayscale data for a single beam. In FIG. 12c, which corresponds to the brush in FIG. 12a, several things can be seen. First, since the sub-brush B is trailing A, the data is delayed. Depending on the amount of trailing, the pixel size, and whether or not pixels for sub-brushes A and B are located at the same coordinates, the grayscale data may or may not be different. FIG. 12c shows the same data for 1206A and 1206B, only delayed in time. The time delay is also depicted for the boundaries of the aperture 1204A-1205A and 1204B-1205B. In order to correct for the difference in diffraction efficiency, depending on the difference in the angle η, the data streams 1206A-B have been multiplied with two different envelope functions 1208A-B. In a further refinement, it is possible to generalize the scheme in FIG. 12c and use different envelope functions 1208 for each beam in the brush 1200, as a way of correcting higher-order errors resulting from high ξ angles, aberrations, and/or more complex brushes, for instance the brush shown in FIG. 15d. Then, each beam has a different angle η and a slightly different envelope function. The envelope functions can be based on calculations from a mathematical model or derived from empirical calibration.

FIG. 13 shows a block diagram generally depicting how the corrections can be implemented in a writer. On the right, the light energy propagates from laser source(s) 1314 to the workpiece 1399, passing in turn through beam splitters 1329 producing a beam brush 1339, multibeam modulator(s) 1349, the AOD scanner 1369 and a lens 1389 for focusing the brush of beams on the workpiece. A single laser or multiple lasers may be used to build a brush of beams 1339, which are scanned by a single AOD. Such multi-laser brushes will be discussed below.

The data is entered, typically in a vector form 1342 such as Gerber, GDSII, or OASIS format data, and rasterized 1343 to a bitmap or similar representation. Similar representations include the segment representation used in Micronic Laser's Omega mask writers and a compressed or partially fractured format. The bitmap information is then combined in a data combiner 1345 with information, such as the envelope 1110 that describes the power compensation for the acoustic attenuation in the AOD 1364 and/or the information used to improve the equalisation between the beams 1366, such as the A and B envelopes 1208A and 1208B in FIG. 12c. Conceptually, these types of information are envelope functions, which are multiplied with the grayscale data 1107. In practice, there are non-linearities in the modulator. Refined, if desired, to take the non-linearities into account, the multiplication actually applies a non-linear function 1325. Information about the non-linearity is stored in memory and used to calculate the correct grayscale values in a data combiner, most suitably a signal processor, which may be implemented by a general purpose processor or an FPGA. Other representations than those mentioned may be used during the operations, and the envelope function may be represented differently, e.g. as logarithms, with the same result of removing negative effects of the acoustic attenuation and η-dependence in the AOD. When the modulators 1349 are SLM mirrors operating in a diffraction mode, driving the modulators may be implemented using a digital-to-analog converter (DAC) 1347.

Figure 15A:
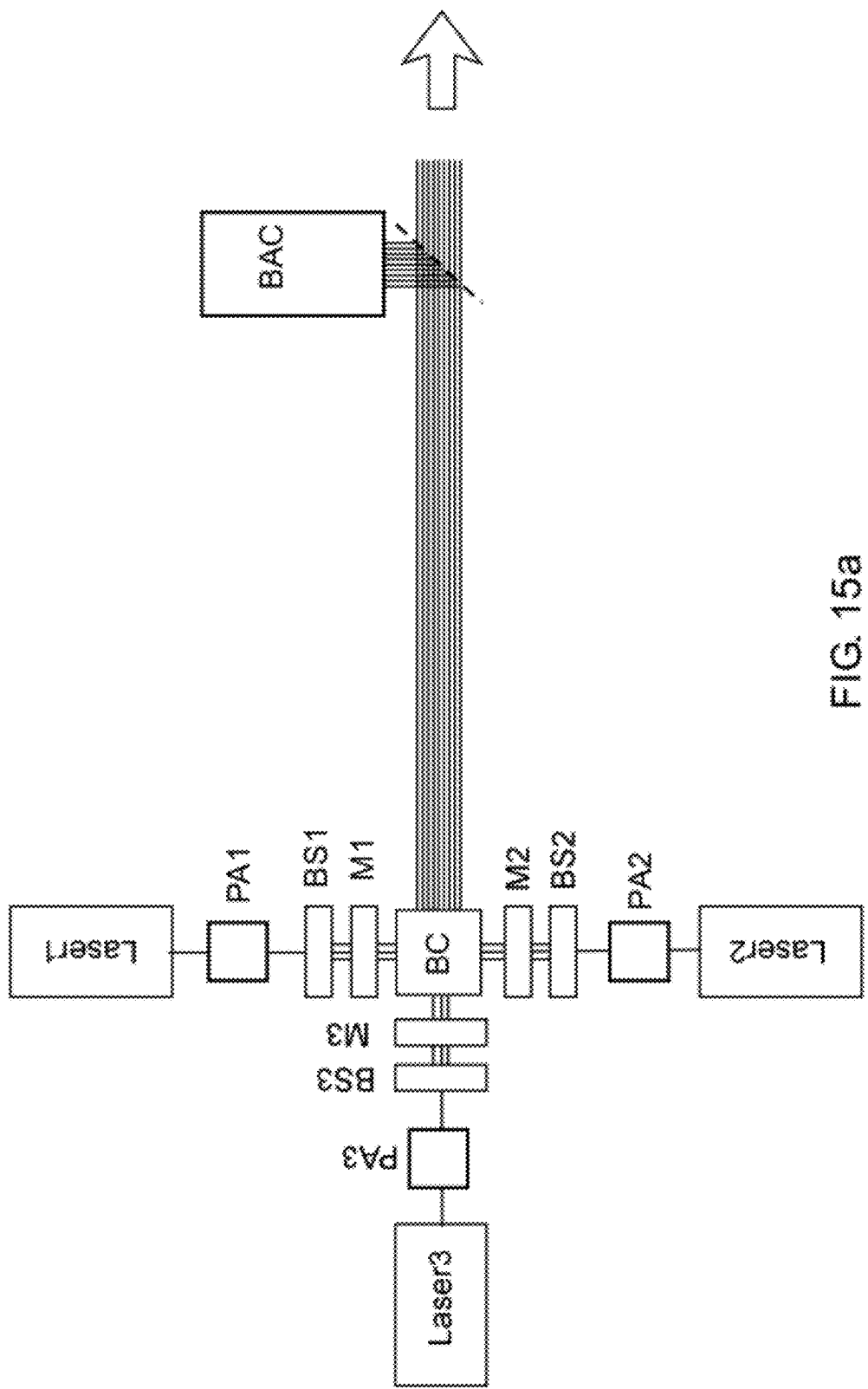
FIG. 15a: Making a complex brush using multiple lasers.

FIG. 15a shows how a complex brush can be assembled using light from three lasers. Combining beams, as in FIG. 15a, is useful. First, it increases the writing speed in a writer that has power-limited throughput. By forming a brush with light from two or more lasers, the power deposited on the workpiece may be increased in an otherwise unchanged writer. Second, it increases the writing throughput in a writer that is limited by the pixel rate, i.e. by the modulation frequency of the beams and the number of beams that can be fitted inside the optical field of the writer.

In FIG. 15a, beams from three lasers are combined. In the laser arms, there are a beam splitter BS and a multibeam modulator M. The beams are combined in the beam combiner BC. The resulting brush combines the brushes from all of the laser sub-brushes with separated beams.

There are two possibilities in regard to interference in a combined brush. Beams from a single laser normally interfere, and the spots on the workpiece must be separated enough to make any overlap between the spots negligible. Beams from two lasers may be interfering if the lasers have the same frequency, e.g. if they are emanating from continuous gas or solid state lasers. They may not interfere if they have a slight frequency difference, such as that between different semiconductor lasers where the wavelength depends on the stoichiometry of the laser crystal.

The frequency difference needed for non-interference is very small, e.g. the pixel clock frequency or higher. At a difference of approximately twice the pixel clock, the phase will vary between the two beams by approximately 47c in each pixel, essentially averaging out any interference. A larger difference will give even better averaging of beating effects, and a difference of exactly N times the pixel clock frequency (N=1, 2, 3 . . . ) will also give efficient suppression of interference. Alternatively, a frequency difference can be created with a frequency shifter, such as an acousto-optic frequency shifter. Suitable frequency shifters are commercially available from Brimrose Corporation of America (Maryland, USA), Laser 2000 (Germany), and other companies.

As illustrated, the combined beams create a brush in which some beams come from one laser and others from another laser, rather than adding the power from the lasers into a superimposed beam. Since the beams are writing different pixels in the same pattern, it is useful that there is no drift in the position of the beams.

FIG. 15a shows a beam alignment camera BAC, which detects any drift in the beams' positions. In the arms of the laser source, there are pointing actuators PA1, PA2, PA3, which are controlled by at least one alignment camera. The pointing actuators bring the beams back into alignment if they stray. The beam alignment camera has optics to make a picture of the magnified brush on an image sensor. The center of gravity of each beam is determined from the image and compared to the desired beam positions. Detected errors are corrected by tilting mirrors, shifting lenses, rotating wedges, or manipulating similar structures. The camera also can be used to calibrate the power in each beam by providing feedback to the modulator for the beam. The beams are set to a series of nominal powers and the integrated power detected for each spot is determined for each nominal power. Corrections to the nominal power settings are calculated and the nominal settings are corrected. The procedure is repeated until the desired accuracy is obtained. The corrected settings give the non-linearity data used in the data combiner 1345 in FIG. 13. The non-linearity of the modulators, including any effects of the electronic system, DACs, etc., can be empirically determined with the beam alignment camera.

FIGS. 15b-g show a variety of brush designs. The optical system, in particular the entrance side of the AOD, has a limited field, shown as a dashed frame in FIG. 15d. In the scanning direction indicated in each figure by an arrow with hollow head, the useful optical field is mainly determined by the diffraction efficiency (FIG. 14b) and may be extended from a field holding only a single row of beams (FIGS. 15b and 15f) to a somewhat larger field with room for 2D brushed (FIGS. 15c, d, e and g) through compensation of the variation in DE between beams by the methods explained in FIG. 12. In the perpendicular direction, it is limited by aberrations, mainly distortion. For throughput, it is advantageous to have as many spots as possible within the field, but spots which interfere cannot be separated by less than the distance "s," which is the minimum safe distance for interfering beams, or else there will be interference crosstalk that creates beating and strong noise in the beam power, thereby reducing the pattern fidelity.

The measure of the minimum safe distance "s" relates to the Full-Width Half-Maximum (FWHM) profile or, alternatively, the $1/e^2$ radius of the beam. These are standard measures of optical beams. For a Gaussian beam, both the FWHM $1/e^2$ measures can be expressed as a beam radius or diameter. The FWHM is the beam diameter at which the optical intensity of the beam drops to half the axial optical intensity of the beam. Similarly, the $1/e^2$ radius of the beam is the beam radius at which the optical intensity of the beam has dropped to 13.6% of the beam's axial optical intensity. For Gaussian beams, the FWHM beam diameter is 1.18 times the $1/e^2$ Gaussian beam radius. Encyclopedia of Laser Physics and Technology, "Beam Radius" accessed at www.rp-photonics.com/beam_radius.html.

Using the $1/e^2$ beam radius which we call the "e-radius", we define the center-to-center "safe distance" for Gaussian beams to be at least 4*e radius. At this safe distance, flying spots projected by the beam are considered and defined to not interfere. In some applications, especially high precision application, spacing of 1.25*safe distance may be preferred.

For non-Gaussian beams, the safe distance is defined in relation to the ISO Standard 11146, so-called D4σ method. Applying this method, on obtains 4 times the standard deviation of the intensity distribution. This gives the same result as the "e-radius" for Gaussian beams. Ibid. Applied to non-Gaussian beams, center-to-center separation of 4*D4σ distance is considered and defined to be a safe distance.

Overlap in time can be measured using a FWHM pulse duration. First and second flying spots are considered and defined not to overlap in time if the second spot follows the first in time by at least 3.39*FWHM pulse duration. This separation in time can be measured pulse center to pulse center or in an equivalent fashion. For some high precision applications, it may be preferred to separate pulses in time by at least 4.24*FWHM pulse duration.

Figure 15D:
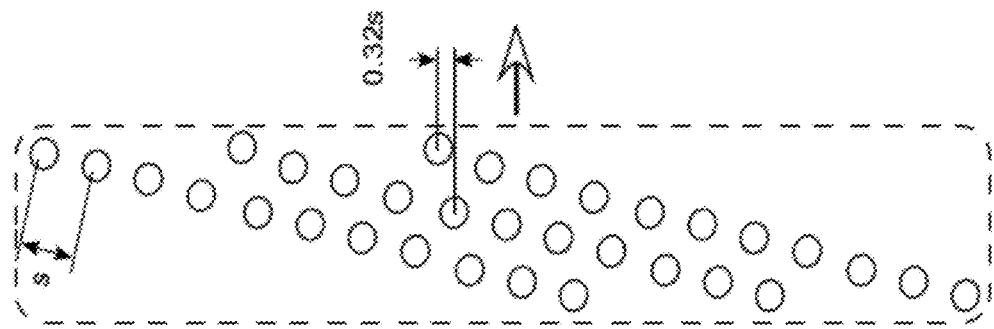
FIGS. 15b-g: Examples of multibeam brushes.
Figure 15G:
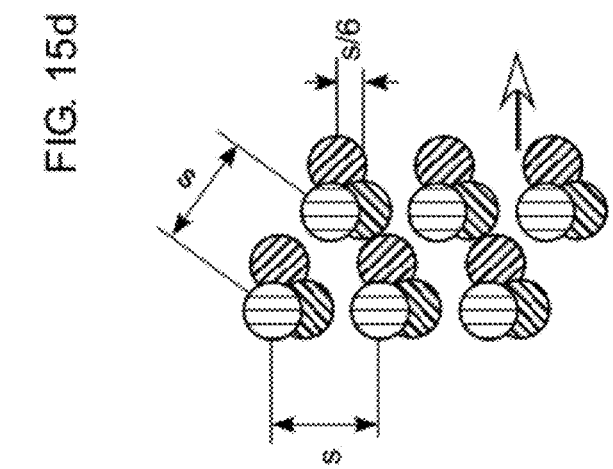
Figure 15C:
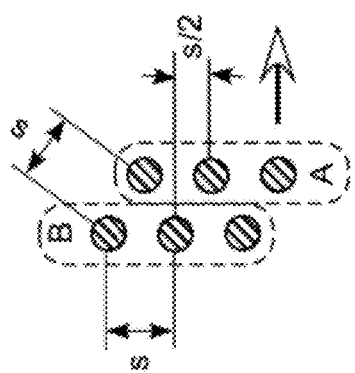
Figure 15F:
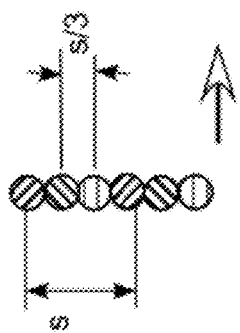
Figure 15B:
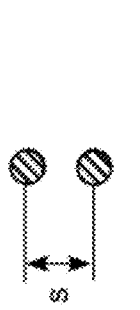

Without the method of FIG. 12, the brush may look like in FIG. 15b: a single row of spots. With the compensations in FIG. 12, it is possible to add a second row of trailing spots B to the first row A, as schematically depicted in FIG. 15c. It may also be possible to have more than two rows without sacrificing quality. With two staggered rows, as in FIG. 15c, the distance between rows of pixels in the x direction is s/2, and the number of spots in the field has been doubled. To avoid interference between coherent beams the staggered row B is placed at a distance from row A that makes the distances between all spots at least "s."

FIG. 15d shows a more complex brush with three rows and spots in a hexagonal pattern around a center spot. This figure illustrates that every beam may have a unique ξ coordinate and the methods of FIG. 12 can be used to equalize all of them. The distance between the written pixels in FIG. 15d is approximately 0.32 s. With individual equalisation for each spot, the number of possible complex brushes is without bounds. Furthermore, the brush in FIG. 15d can be decomposed into sub-brushes in many ways.

Figure 15E:
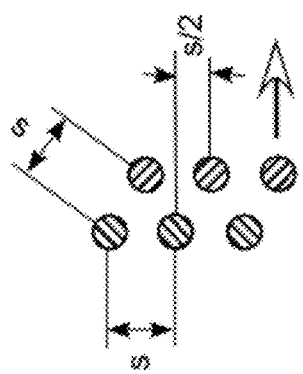

FIG. 15e shows the same brush as FIG. 15c, but the different hatching indicates that sub-brushes emanate from two different lasers, thereby having twice as much power as in FIG. 15c. The beams are positioned to avoid potential interference between the pair of lasers, and the minimum distance "s" is respected.

In FIG. 15f, three non-interfering lasers are used. The sub-brushes can be placed with the spots arbitrarily close, because the beams are non-interfering. FIG. 15f solves a problem of too little power or too few pixels written per second by using two or more lasers with a frequency difference large enough to even out interference crosstalk in every pixel, even without extension of the field by the method of FIG. 12. The lasers can be three semiconductor lasers selected to have slightly different frequencies, or they can be three lasers having essentially the same frequency, but frequency-shifted by a few hundred MHz from one another. For instance, in a system having a pixel clock of 100 MHz, one laser can be shifted by +200 MHz and another by −200 MHz from a central beam frequency. Furthermore, if the problem to be solved is too few pixels per second but the power is adequate, it is possible to split a single laser into three (or generally N) beams, frequency-shifting two (or more) of them and forming the brush in FIG. 15f from three (or more) sub-brushes.

If a single pulsed laser is used, which has sufficiently short pulses, it is also possible to remove interference crosstalk by time-shifting arrival of the beams. Time-shifting can be accomplished by routing parts of the beam over different paths with different path lengths, so that arrival of the pulses at the workpiece surface does not overlap in time. For instance, with a pulse length of 1 nsec, the pulse length is about 300 mm. Three sub-brushes with a 1 meter difference in path length can be combined as in FIG. 15f to form a brush. The minimum distance between sub-brushes can be smaller than the safe distance "s," because the separation in time avoids interference or coherent crosstalk among sub-brushes.

Finally, in FIG. 15g non-interfering sub-brushes, as in FIG. 15f, are used, with the methods of FIG. 12 applied to make each sub-brush two-dimensional. The depicted positions of individual brush beams respect the minimum distance "s." The result is six times the density of the simple brush in FIG. 15b, six times more pixels per second and, if separate lasers are used for the three sub-brushes, three times higher power.

Figure 16:
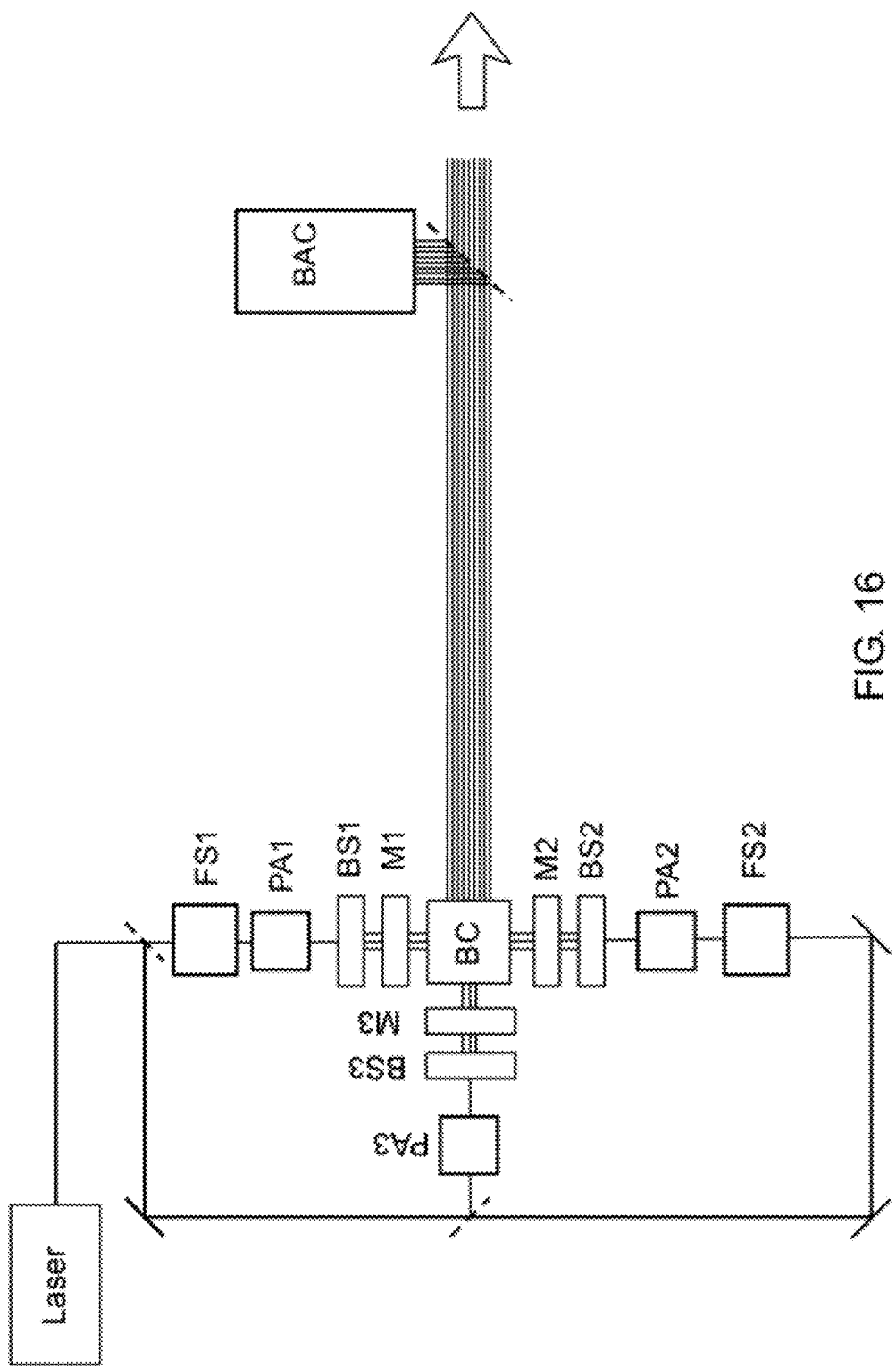
FIG. 16: An example embodiment where a complete brush is made from a single laser source.

FIG. 16 shows the generation of the same complex brush as FIG. 15a, except that a single laser is used to form the three (two or more) sub-brushes. The laser light is split, for instance, by semitransparent mirrors. The lower and upper paths 1 and 2 apply frequency shifters to the split portions of the beam. FIG. 16 also shows different path lengths from the laser to the beam combiner BC, which can be used to make beams consisting of short pulses non-interfering. If short pulses are used, the frequency shifters can be omitted. FIG. 16 is primarily a solution to the problem of too few pixels per second, as splitting out part of one laser does not increase the power available. Complex brushes as shown in FIG. 15g can be created using a single laser source. When sub-brushes are formed by beams split from the same laser, pointing errors in the laser have less importance since they only generate common-mode errors, e.g. shifts in the entire patterns. With a single laser source, the beam alignment camera BAC and painting actuator PA1-3 may or may not be necessary, depending on the stability of the optical system and the required pattern quality.

One can describe parts of this technology as follows. The problem of effective power equalisation across chirp frequencies applied to drive an AOD, particularly when a wide bandwidth is used, can be solved by recognizing occurrence of a center of gravity shift in the diffracted input optical beam that impacts telecentricity when the AOD operates with high frequency modulation. Having recognized this subtle problem during design studies for an innovative, high bandwidth AOD, one proceeds by applying a relative intensity modulation to a beam of radiation before it reaches the AOD, or alternatively after. Then, by applying a complementary AOD power calibration across frequencies used to drive the AOD, the combination of the relative intensity modulation and the complementary AOD power calibration generates a non- or minimally shifting center of gravity of the diffracted beam over the scan by the AOD.

FIG. 17 depicts combining 2AOMs. It is a schematic of how to combine two multibeam AOMs. The upper part of the figure shows a cross-section parallel to the AOM, in the so-called X-direction. The lower part shows a cross-section perpendicular to the AOM, in the so-called Y-direction.

Figure 18:
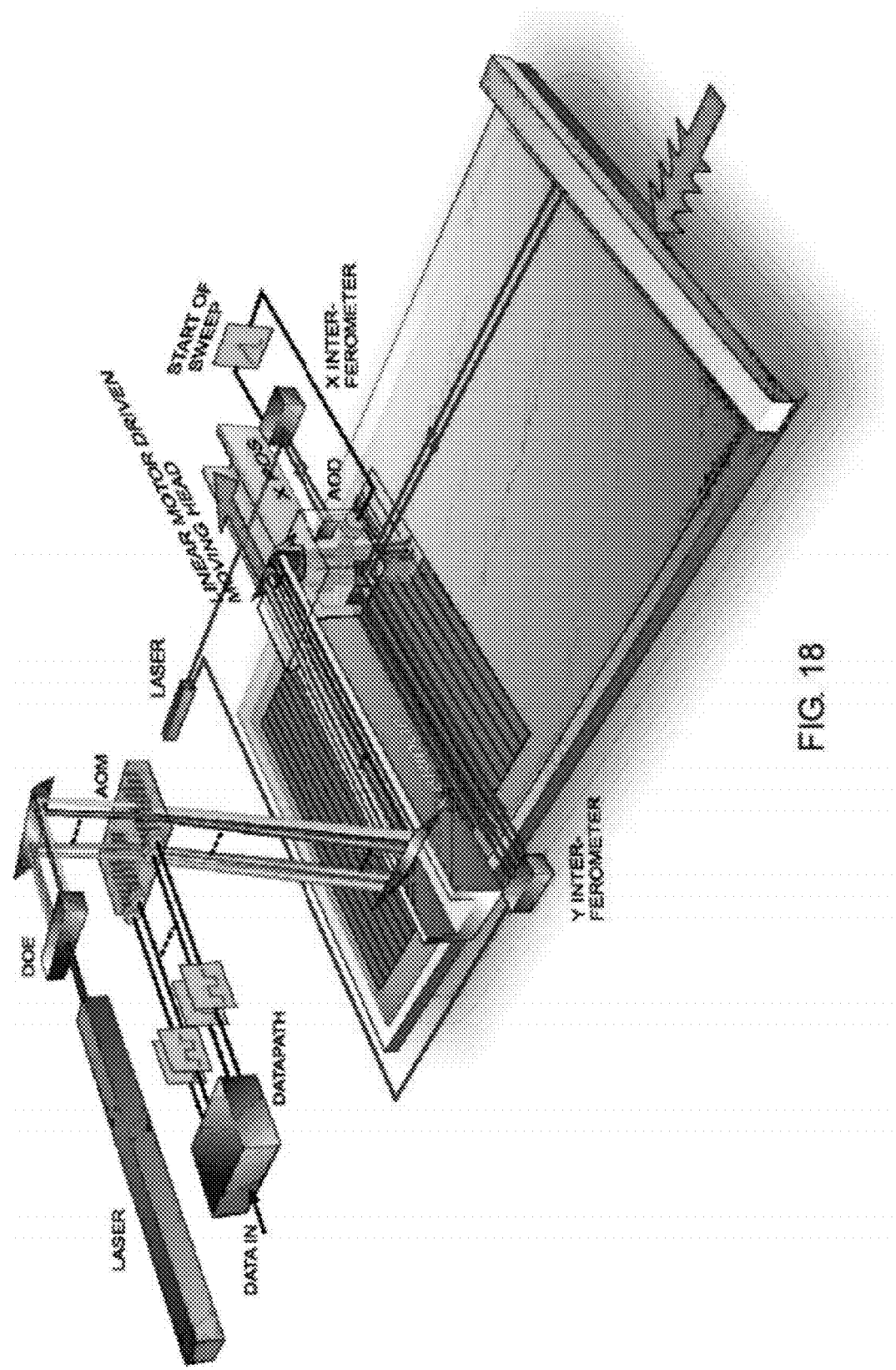
FIG. 18: A sample system embodying some of the technology disclosed.

FIG. 18 illustrates a sample system embodying some of the technology disclosed. In a sample system, the laser is a 413 nm Kr-Ion continuous laser. A minimum of 22 writing beams are used. Two modulators are depicted. The NA of final lens is 0.70. The pixel size is about 175 nm in X and Y. Multi-pass writing is used, with writing on the return stroke or bi-directional writing. The optical path has a constant optical path length. With 22 beams, the estimated throughput is 685 square mm per minute.

The invention is further described in relation to FIGS. 19-25. The inset in FIG. 19 shows a simplified acousto-optic deflector, consisting of a crystal 1905 and a transducer 1903 for converting an RF signal 1901 to ultrasound and injecting this acoustic wave into the crystal.

The acousto-optic crystal may be TeO2 which has transparency into the UV and a very slow sound propagation in the shear mode. Low acoustic propagation speed gives smaller apertures at a given bandwidth product B*T proportional to the number of pixels resolved along a scan line. T is the time it takes for the ultrasound to travel across the aperture. TeO2 is further optically active, a fact which is often used to increase the bandwidth in devices made in the material. Similar properties can be found in other materials such as certain mercury compounds, but so far TeO2 is the industrially dominating material in the violet and shorter wavelengths.

A real deflector may be more complicated in the sense that it may be cut off axis to exploit the optical activity and the sound column may propagate at an angle to the transducer. Off-axis AODs are known in the art. One advantage of off-axis AODs is that the bandwidth can be made wider and the acoustic attenuation may be less at an off-axis angle than along a crystal direction. The transducer may consist of a single ultrasound emitter or several, and the emitters may possibly be driven with phase delays between them to enhance the diffraction efficiency over an extended frequency band ("beam steering").

The deflector in FIG. 19 further has a mask 1907 defining a clear aperture 1906. The crystal may be larger than the aperture, as shown in the figure where the crystal is 6 mm long, and the aperture is 4 mm. The slow-shear mode in TeO2 propagates at 0.64 mm/µs independent of the frequency. Thus the aperture time T in the shown example is 4/0.0.64=6.25 µs.

The acoustic wave propagating in the crystal is attenuated by 16 dB/(GHz^2*µs) on axis and significantly less in off-axis configurations. The diagram in FIG. 19 shows the attenuation of power injected from the transducer depending on the frequency from 150 to 300 MHz. The graphs are computed for an off-axis cut with 6 dB/(GHz^2*µs). In a real crystal this would give a strongly oblique propagation inside the crystal, which for simplicity is not shown in the inset.

Figure 20:
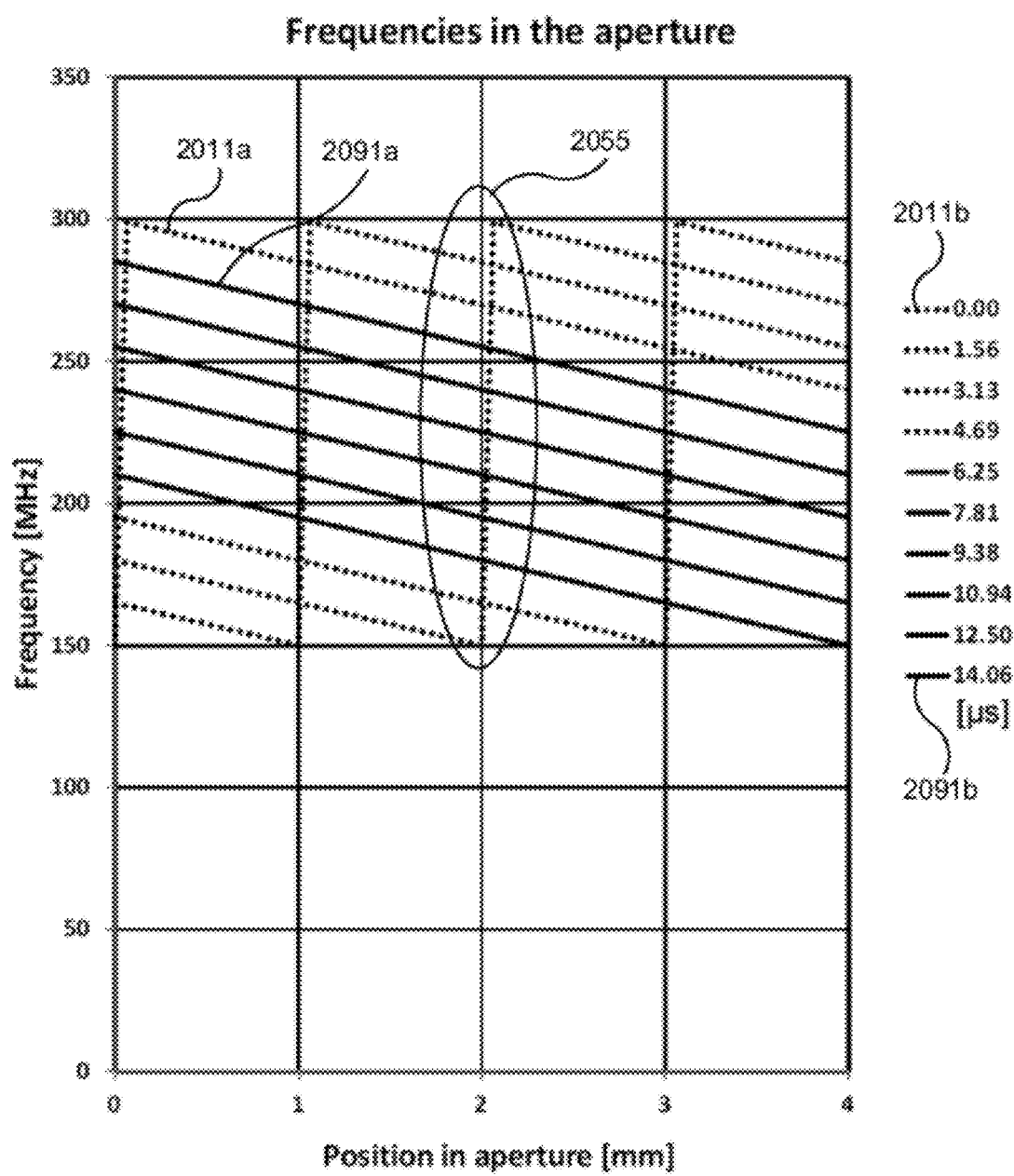
FIG. 20 shows the travelling of the chirp signal through the crystal at a number of times since the start of the chirp.

Note that the graphs in FIG. 19 do not show instantaneous power profiles through the crystal. How such profiles can be determined is shown in FIG. 20. For each position in the crystal, the sound wave is delayed by the time it has taken to propagate to that position. The transducer is normally driven by a nearly linear rising chirp, i.e. a frequency which starts low and rises by essentially the same amount per microsecond, e.g. 10 MHz/µs. A falling chirp is also possible, but is less often used. The methods disclosed in this application also apply to cases where the chirp is falling, with appropriate adaption. The frequencies in the crystal are shown in FIG. 20. Each line corresponds to one instance in time. From the start of the chirp until just before 6.25 µs the transition from the previous chirp, i.e. the jump from high to low frequency 2055, is visible in the aperture, represented by the dashed lines. From 6.25 µs till the beginning of the next chirp 2011a-b, the frequency curves have no discontinuity and the deflector can be used for scanning a light beam, e.g., 2091a-b.

Figure 21:
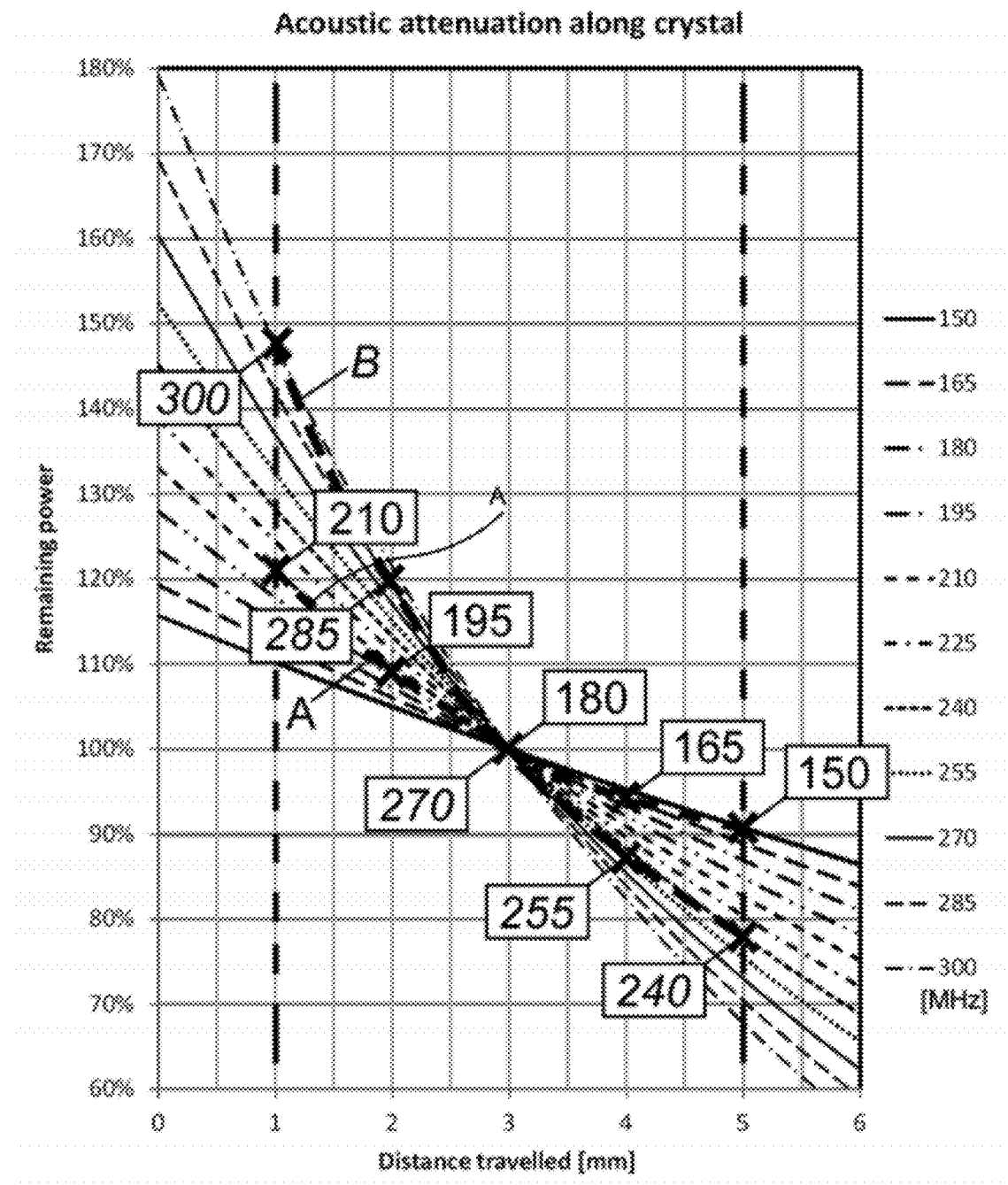
FIG. 21 shows first how each frequency is sent out with a different power so that they all have equal power at the center of the aperture. It further shows how curves showing instantaneous power through the deflector are derived from the attenuation curves.

In FIG. 21 power equalisation is applied to the RF. The instantaneous power profile is found by connecting the points showing the frequency and the remaining power at each point, thick dashed lines. The lines A and B show power profiles early and late in the scanning cycle. Equalisation in this context means a cyclic variation of the RF power delivered to the AOD, i.e. a variation depending on time during the scan cycle or, equivalently, on the RF frequency. The equalisation in FIG. 21 is for constant power in the diffracted beam as used in prior art.

Equalisation corrects for three different effects. There is an impedance-matching network between the RF input and the transducer, and the transducer has a frequency-dependent efficiency, e.g. due to mechanical resonances and attenuation. The first effect the power equalisation corrects for is this rather complex frequency dependence of the coupling efficiency from RF power to acoustic wave power. The second effect to correct for is the crystal efficiency, i.e. the frequency dependence of the coupling from acoustic power to diffracted light power. The third is the effects of acoustic attenuation. To simplify the description of the invention, we will assume that both RF matching and crystal efficiency are unity, i.e. lossless, and we will only describe the third part of the equalisation. We will later show that the RF matching and diffraction efficiency can be measured and calibrated for, and that the acoustic attenuation can be dealt with analytically.

Prior art equalisation aims to make the optical beam being diffracted and scanned have constant power during the scan. Before the instantaneous power profiles A and B have been determined in FIG. 21, the RF power has been varied as a function of frequency, so that the acoustic power is frequency independent at the center of the aperture. Since the scanned beam typically is a Gaussian laser beam with most of the power close to the center of the aperture, this very nearly makes the beam have nearly constant power over the scan. There is a small second-order power variation due to the curvature of A and B, which may be neglected here for the sake of the discussion.

The power in the diffracted beam across the aperture early (dashed curve A) and late (curve B) can be determined in the following way: The frequency chirp starts at the lowest frequency, here 150 MHz. The time span when the deflector may be used for scanning a beam with high purity starts when the lowest frequency of 150 MHz has reached the far end of the aperture in FIG. 21. At this instant in time, the ultrasound wave at the center of the aperture has a frequency 180 MHz. At the left end of the aperture, near the transducer, the frequency is 210 MHz. Each of these frequencies is sent out from the transducer to have the power normalized to 100% when the ultrasound wave reaches the center point of the aperture. The graph shows how each frequency from 150 to 300 MHz in steps of 15 MHz is emitted by the transducer and attenuated as it travels along the crystal. The dashed line "A" connects points (210, 195, 180, 165, 150 MHz) across the length of the aperture at the start of the scanning cycle. At different positions the chirp has different frequencies. The power of a chirp at a particular position in the crystal depends on the emitted power for each frequency, the distance travelled, and the attenuation for the frequency. The instantaneous power profile B at the end of the scan cycle is determined in the same at the instant in time when the highest frequency just reaches the near edge of the aperture, the point marked 300. Five points across the aperture at a particular instant in time experience driving frequencies of 300, 285, 270, 255, and 240 MHz. In the graph, curve "B" connects these points.

Curves A and B have different slopes. If a Gaussian beam is sent into the deflector and centered to the aperture, the higher acoustic power at the beginning of the aperture (to the left in FIG. 21) will cause a skew in the diffracted beam, so that the left side will have more power than the right side and the peak will shift to the left. It will appear that the exit beam comes from a position slightly left of the center. There will also be some amount of aberrations of the beam, but this will normally be less important than the shift. If the scanning beam is used in a telecentric high precision writing or measuring system, the apparent beam shift will be seen as a telecentricity error. The beam is shifted from the optical axis in the aperture plane of the final lens, and there will be a geometric shift of the image sideways through focus. In microlithographic pattern generators, it is useful to correct this error to avoid lateral misplacement of the written patterns.

Both curves A and B cause apparent lateral shifts in the diffracted beams, but with unequal amounts. A constant shift can often be compensated by fine tuning, e.g. by counter-shifting the beam coming into the AOD. But varying shifts over the scan are more objectionable. In this example, there is more apparent shift at the end of the scan (B) than at the beginning (A). This will mean that if the scan is calibrated to have the correct length at perfect focus, the scan will be longer at one value of (unintentional and unavoidable) defocus and shorter at the opposite value of defocus.

A commonly used design rule for AOD scanners in prior art is that the highest used frequency is the one where the acoustic attenuation is 3 dB across the aperture. FIG. 21 is drawn with the assumptions that the aperture is 4 mm, the velocity of sound is 0.64 mm/µs, and the acoustic attenuation is 6 dB/(GHz^2*µs). This design gives 3 dB attenuation across the aperture at 282 MHz or close to the 300 MHz curve. The example AOD in FIG. 21 is therefore at the limit of what is possible using prior art in a material with 6 dB/(GHz^2*µs), e.g. TeO2 at a rather high off-axis angle.

Figure 22:
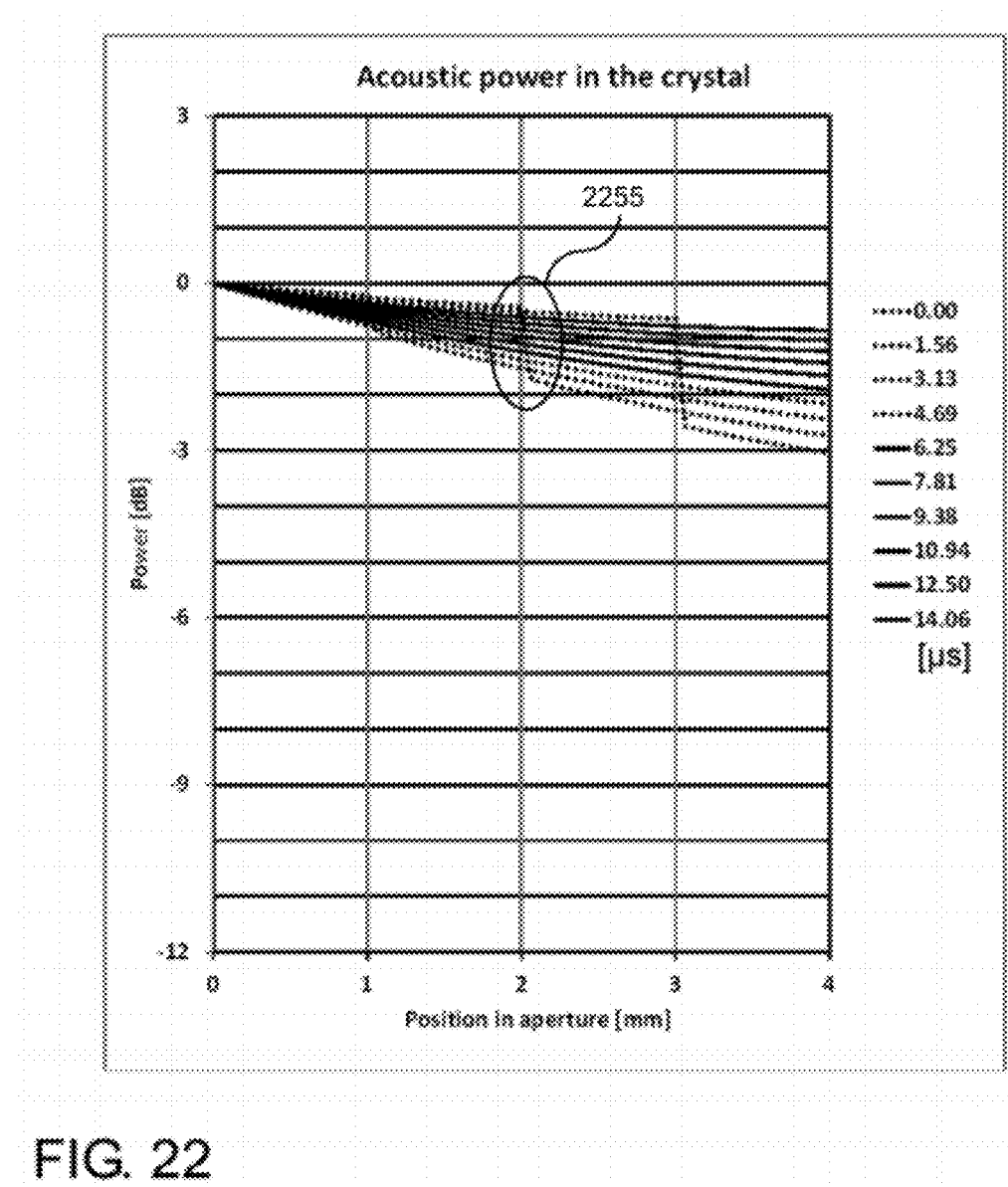
FIG. 22 shows the power through a deflector without equalisation at different times.

FIG. 22 shows the instantaneous unequalized acoustic power across the aperture of the example AOD. In this figure, no equalisation is applied. RF matching and crystal efficiency are assumed perfect. For simplicity, the distance from the transducer to the beginning of the aperture has been assumed to be zero. The solid lines show times when the AOD can be used for scanning a laser beam, and the dotted lines times when the jump from high to low frequency between two chirps 2255 is visible in the aperture.

Figure 23:
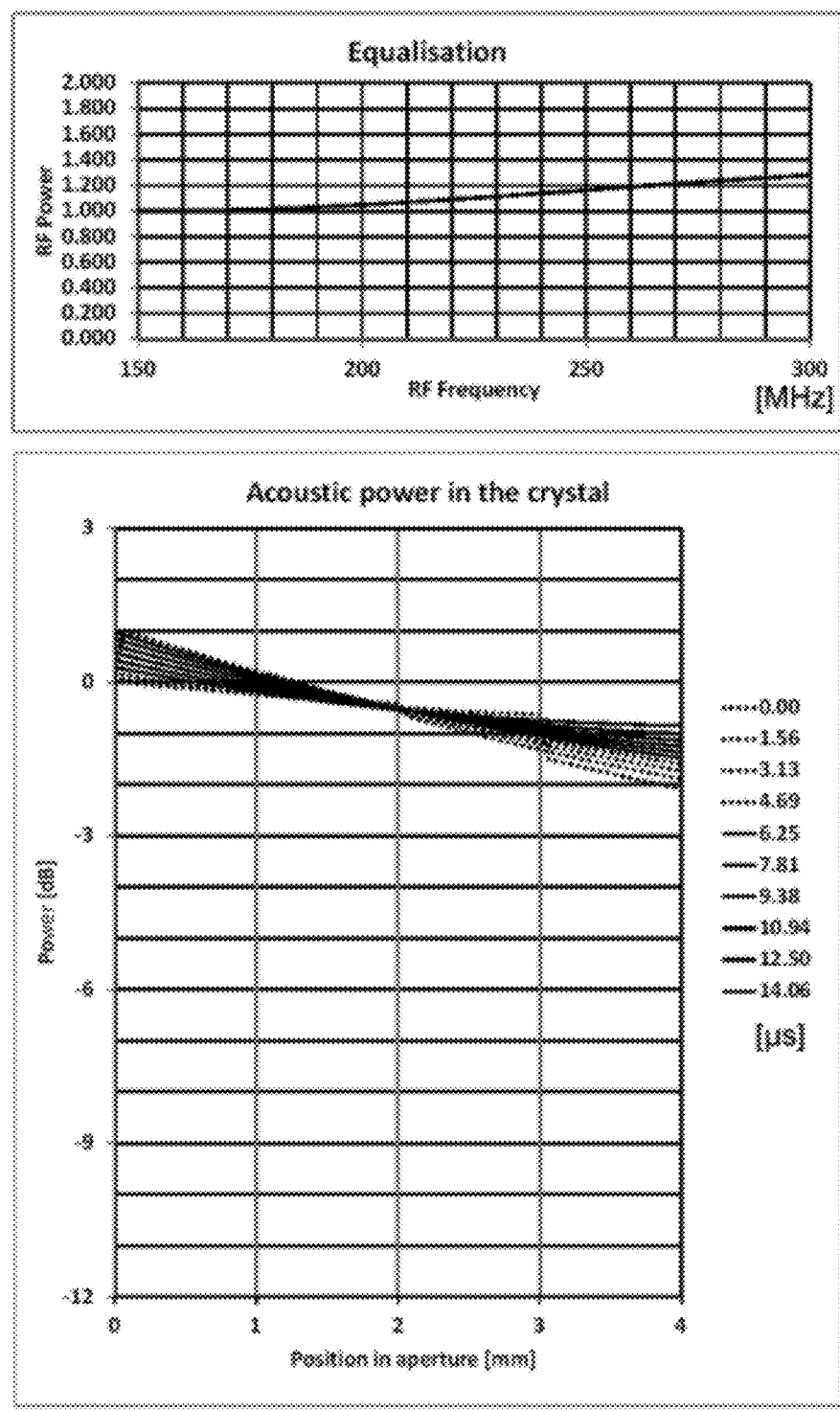
FIG. 23 shows a conventional equalisation as used in prior art.

FIG. 23 shows constant power equalisation following prior art. With this equalisation the power in the scanning beam is nearly constant over the scan. The top graph shows how the RF power increases with increasing frequency during the chirp. Since the attenuation from the transducer to the center of the AOD aperture grows with increasing frequency, the emitted ultrasound power increases with increasing frequency. With this equalisation, the modulator is simply driven with pattern data. If the pattern data is binary, the modulator switches between full on and full off. For grayscale data, the modulator modulates each pixel to its gray value. The remaining problem with this constant power equalisation as used in prior art is that the diffracted power across the aperture has a slope that varies with time, giving telecentricity errors, aberrations and a focus-dependent scan length.

Advanced Power Calibration

Figure 24:
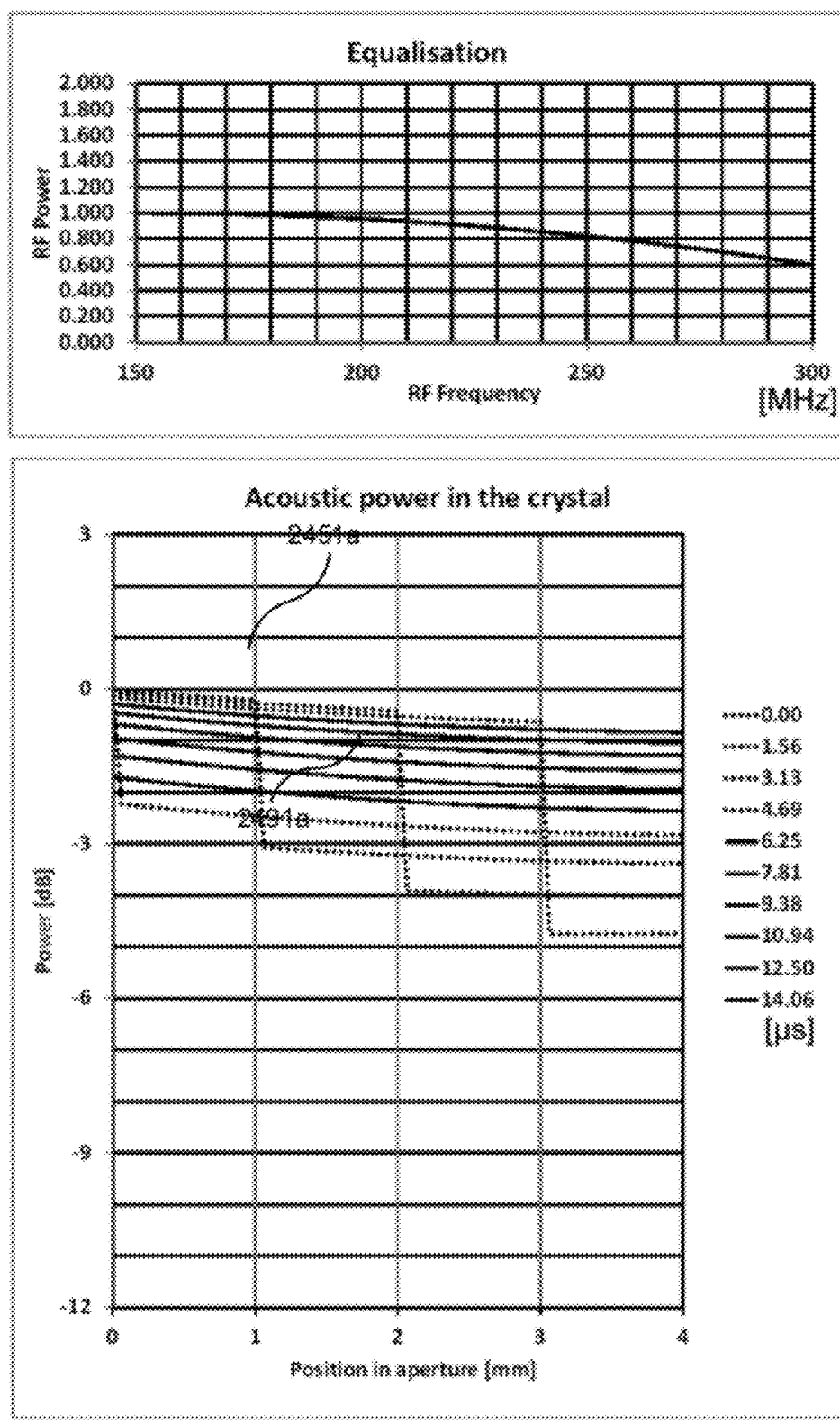
FIG. 24 shows an example of equalisation following the invented method for the same example deflector as in FIG. 19.

FIG. 24 shows the same AOD as in FIGS. 22-23 but with the novel advanced equalisation method. The prior art equalisation objective to make the diffracted power beam constant over the scan as in FIG. 23 has been abandoned. The equalisation aims to reduce the time variation of the slope of the diffracted power across the AOD aperture. The top graph of FIG. 24 shows that the equalisation curve is the opposite of the curve in FIG. 23 with RF power falling when the frequency rises. The bottom diagram in FIG. 24 shows the power across the aperture for different times. The logarithmic scale using decibels shows a constant relative shape better than a linear scale when the average power of the curves are different. It is seen that the shape of each curve is similar but that the power at the center of the aperture is falling with time. Compare 2451a to 2491a. Thus, there is no varying telecentricity or scan length, but instead the power varies over the scan. In order to flatten the power the data modulator in series with the AOD is driven with modified data that contains a compensation for the varying diffraction efficiency of the AOD. In particular, the transmission of the modulator is made to increase with time, so that the white level of the printed pattern is constant over the scan.

Equalisation in the RF driving of the AOD is changed to use both the RF power and the modulation of scanning laser beam power. Two conditions can be achieved at the same time, namely constant beam power over the scan on the workpiece and constant profile in the deflector. The latter can be more or less ambitious and aim for a reduced variation of the slope, no variation at all, or no slope at all in the power profiles in the AOD. Setting a high goal, such as no slope at all, has a higher cost in the sense that the equalisation will use a larger range of RF power and the modulator consequently will need to allocate more of its dynamic range to equalisation. The optical transmittance of the system will also be much less (more laser power lost in AOD and modulator) if full cancelling of the slopes in the power curves is sought. In a practical case it is more likely that a moderate amount of equalisation of the power curves as in FIG. 24 is used. The remaining apparent lateral displacement of the diffracted beam may then be compensated by a slight shift in the position of the incoming beam.

Figure 25:
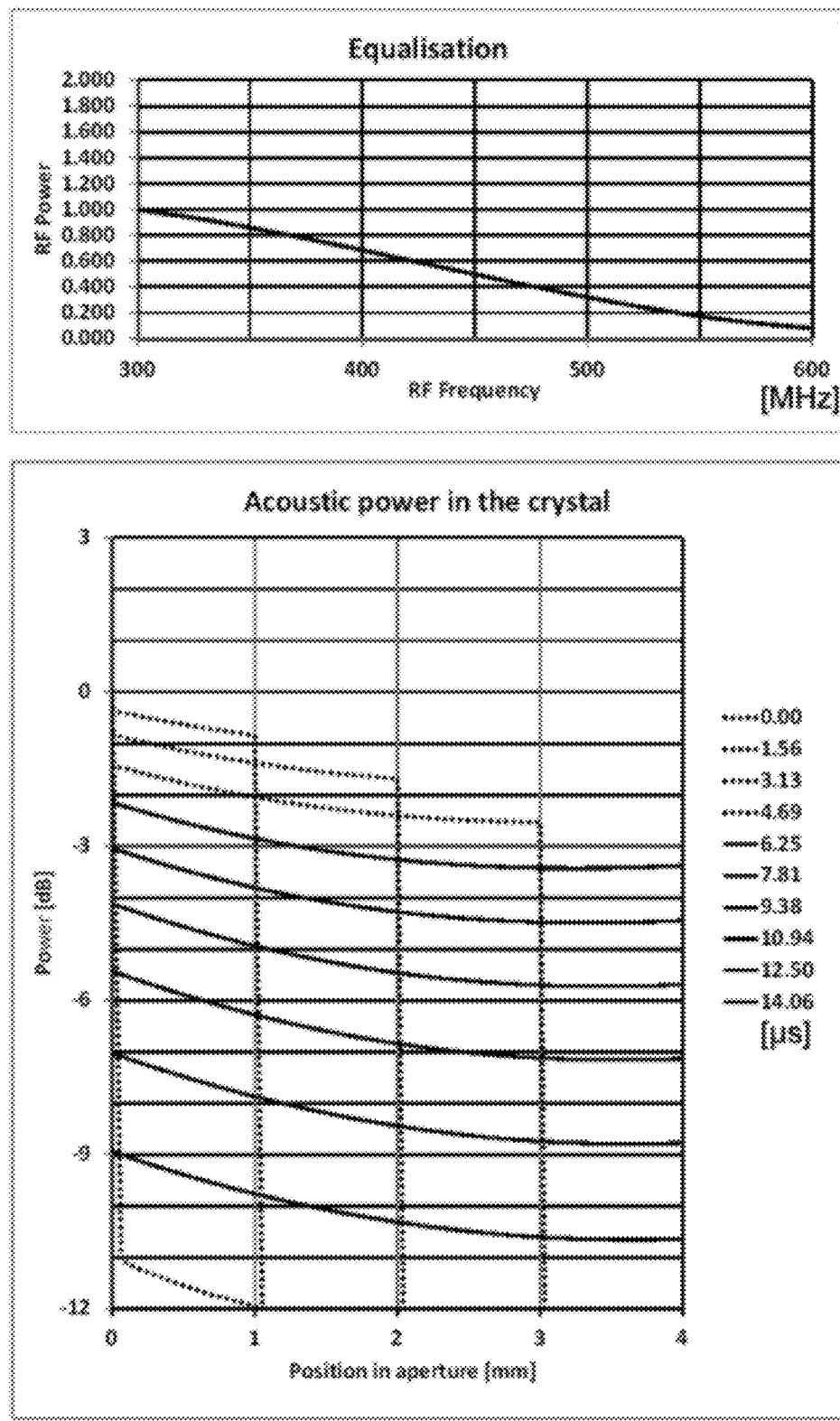
FIG. 25 shows an example of equalisation according to the invented method using the same size and type of AOD crystal, but operating over twice as large a frequency span.

The advanced equalisation in FIG. 24 has the purpose of improving writing quality by reducing telecentricity errors, aberrations and varying scan length. FIG. 25 shows the same crystal as in FIG. 24, but equalized between 300 and 600 MHz in order to increase the writing throughput. The slopes of the power profiles are made reasonably constant over the scan, but the amount of equalisation is much higher (top diagram); likewise, a much larger part of the modulator dynamic range is consumed to bring the beam power back to constant over the scan. The optical transmission is low, less than 10%, since either the AOD or the modulator is driven to low transmission. The example shows that theoretically a very high improvement of the upper frequency is possible. Since the bandwidth and writing speed of the system are essentially proportional to the upper frequency, the system in FIG. 25 writes twice as fast as the one in FIG. 24. Except for the loss in optical efficiency, there is no reason why the AOD in FIG. 25 should not give a high-quality scanned laser beam at twice the writing speed of a conventionally drive AOD.

The useful scan length is proportional to the bandwidth product of the AOD, i.e. to BT where B is the bandwidth and T the aperture time. The AOD in FIG. 24 has B=150 MHz, T=6.25 μs and BT is 937 spots. The AOD in FIG. 25 has B=300 MHz, T=6.25 μs and BT is 1874 spots. If the system in FIG. 25 is scaled back to 150-300 MHz, a much larger aperture with T=25 μs can be used with the equalisation functions staying the same and BT becomes 3750 spots. The throughput is proportional to the bandwidth B, 150, 300, and 150 MHz in the three cases. Therefore, the advanced equalisation presented in this application is shown to give reduced writing errors, higher throughput, and/or longer scan lines.

Calibrating the Equalisation Function.

As described above, the RF equalisation corrects for three effects: first, the RF properties of the driver, cable, impedance matching network, and transducer; second, the crystal efficiency; and third, the acoustic attenuation. The first part, from RF source to mechanical wave in the crystal is complex and contains contributions of a practical nature, such as resonances in the transducer and spurious reflections in the cabling. The second part, the crystal efficiency, can be calculated theoretically, but is more easily empirically calibrated. It also depends on the angle of incidence in the AOD. In a multibeam system where several beams are independently modulated but scanned by the same AOD, the second part may have small differences between the beams, in particular between beams with different angles in the scanning direction. The third part of the equalisation is easily described theoretically since the acoustic attenuation is constant per (GHz^2*μs) and the travelling times are independent of the frequency.

A functional and practical method for calibrating the equalisation can, therefore, be described as follows.

First, the modulator equalisation for each channel is set to equal and constant values. The beam power for a typical diffracted beam (or all diffracted beams together) is measured and the RF power is equalised for constant power over the scan. Now the RF and beam-average crystal efficiency are calibrated. The needed equalisation for the desired reduction of slopes of the power profiles in the AOD apertures is calculated as shown in FIG. 21 and FIG. 24. The RF power equalisation is changed by the calculated difference between the equalisations in FIG. 24 and FIG. 23, if FIG. 24 depicts the equalisation desired. The calculation needs only the velocity of speed and the acoustic attenuation per (GHz^2*μs), both of which are constant for the material and a particular deflector design and can be measured in the lab. Finally, the white level in each beam is equalized by the multiplication of the data by a beam equalisation function, so that each beam has constant power over the scan and all beams have equal power. After this calibration all beams have the same white level, and the desired equalisation for beam quality, scan length and throughput.

Useful Implementations of the Technology Disclosed

Features of the technology disclosed, which may qualify as separate inventions, include:

Using the modulator and RF power to increase the useable frequency range of an AOD.

Using the modulator to widen the optical field of the AOD to make room for a two-dimensional brush without sacrificing writing quality.

A writer with hardware and software for accomplishing the two preceding features.

Getting more power by forming the brush with two or more lasers.

Making a denser brush by adding sub-brushes that do not interfere, because they either do not overlap in frequency or do not overlap in time.

Using beam alignment detectors controlling beam alignment servos to bring the sub-brushes into alignment.

The diffraction efficiency of an AOD varies with the frequency and angle of incidence. The efficiency is large when there is good phase matching between the ingoing and outgoing (diffracted) beams and the sound column. The angle of incidence in the scanning direction is often called the "Bragg angle" since, in simple media such as fused silica, glass, or water the phase matching can be described with a Bragg condition between the sound and the ingoing light.

Modern AODs are physically more complex. The medium is normally a crystal which is birefringent and in many important cases optically active (same as birefringent with circular states or "circular birefringent"). In materials like tellurium dioxide, which is the dominating material for blue to near UV deflectors, and which is both crystalline and circular birefringent, there is a slow shear wave which can be used to get high diffraction efficiency and large diffraction angles. When a crystal is cut with an off-axis angle (i.e. 5-15 degrees), the diffraction efficiency curve has two peaks and gives four times the RF bandwidth of a similar AOD without circular birefringence and off-axis design. See, e.g., Jieping Xu and Robert Stroud, "Acousto-Optic Devices: Principles, Design, and Applications", pp. 344-61 (Wiley-Interscience June 1992).

All AODs are sensitive to the angle of incidence in the scanning direction, to satisfy the Bragg condition by incidence at the Bragg angle. The off-axis AODs have a wide field over which the diffracted beam can be steered, but the input field has essentially zero extension in the scanning direction.

Any change in the Bragg angle leads to a change in the diffraction efficiency curve and leads to uneven power along the scan line on the workpiece.

Two beams with different Bragg angles have different diffraction efficiency over the scan and varying power on the workpiece. Prior art has either neglected the problem, see US (Ted Whitney, RE 33,931) or used multiple beams spread out only in the perpendicular direction (Micronic Prexision 8). The present invention enables the use of more beams in precision writing, and therefore higher throughput, by recognizing the effects of beam-to-beam varying Bragg angles and adding a beam-to-beam correction by separate modifications of the base powers of the beams.

The base power of a beam may be seen as the white level that the beam can write. If the raster data has grayscale data, it may vary between 100% (white) and 0% (black) of the base power, and an area filled with 100% is white in the pattern. The base power can be adjusted at the light source, by a separate modulator or attenuation device or combined in a modulator. It is practical to combine the modulation with raster data with a time-varying modification of the base power of each beam in a single modulation step, e.g. in the same modulator driven by the electrical voltage or current signal from a digital-to-analog converter (DAC). The raster data and the modification of the base power of the beam can be combined in the digital input to the DAC.

The technology disclosed makes faster and more accurate writing possible by enabling that more pixels per second to be written to the workpiece. More pixels per second can be translated to speed, image fidelity or reliability, or a combination thereof. With a faster writing system, more area can be filled with pixels per second, thus giving higher throughput in mm^2 per second at the same resolution and image quality, or if the pixels are made smaller and the optics configured for higher optical resolution, a finer pattern can be written at the same mm^2 per second.

More pixels per second makes it possible to use more redundant writing, e.g. by writing two passes in the time of one pass, or by writing the pixels with more mutual overlap. In either case, there is a reduction in grid artifacts and a hiding of local errors. A faulty pixel is less visible, and the visibility of systematic errors is effectively reduced by multiple passes. Since errors are less visible, a writing machine may occasionally continue to be used, even in the presence of imperfections or malfunctions which would force a system with less redundancy to stop.

The number of pixels that can be written per second is given by the number of beams and the modulation rate of each beam. The modulation rate is largely limited by the crystal physics, e.g. the RF frequency range over which the AOD can function. After having pushed the modulation rate to the limit of possibility, the number of beams is the only parameter to work on.

In prior art the beams were spread out in a one-dimensional brush oriented perpendicular to the direction of deflection. The maximum allowable angle is given by the crystal optics, and the minimum spacing by the smallest distance on the workpiece over which beams do not disturb each other, i.e. do not interfere. In Micronic Mydata's Prexision-8 writer, 11 beams are spread out in a one-dimensional brush with all beams having the same
Bragg angle.

The current invention makes possible a two-dimensional brush, e.g. including 2, 3, 4, 5, . . . , n staggered 11-beam 1D sub-brushes for a total of 22, 33, 44, 55, . . . , 11*n beams. The distance between any two beams is larger than the minimum distance for avoidance of interference ("the safe distance"), but the 2D brush draws a set of scan lines where adjacent lines are closer than the safe distance, e.g. 2, 3, 4, 5, . . . , n times smaller. There is a limited angle range over which the AOD can scan the beams, and the 2D brush consumes some amount of the scanning angle, but in a typical case it is only on the order of 1-2% of the scan length. Therefore, the pixel rate is approximately proportional to the number of beams.

Some Particular Embodiments

The present invention may be practiced as a method or device adapted to practice the method.

One method of implementation forms a dense brush of interleaved flying spots on the workpiece using optics that have a minimum separation distance among flying spots projected onto a workpiece that makes adjoining coherent beams non-interfering. This method includes forming a first brush of flying spots of coherent radiation with a first separation among the first flying spots when projected onto the workpiece that is as large as or larger than the minimum separation distance, and similarly forming a second brush of flying spots of coherent radiation with a second separation among the second flying spots when projected onto the workpiece that is as large as or larger than the minimum separation distance. This method is characterized by the further action of interleaving the first and second brushes of multiple coherent flying spots where the distance between individual flying spots in the first brush and individual flying spots in the second brush when projected onto the workpiece is less than the minimum separation distance, wherein the first flying spots are conditioned to not interfere with the second flying spots.

Many options are available for enhancing this method. The following options can be used in any combination, as if they were described by multiply dependent claims depending from other multiply dependent claims.

In the method described, the first and second flying spots can be conditioned not to interfere by forming the flying spots from different first and second coherent sources. Or, they can be conditioned not to interfere by forming the flying spots from coherent sources at effectively different frequencies. To achieve different frequencies, one or more frequency modifiers or shifters are used to modify the frequency of one or more of the coherent sources. Beams from a single coherent source can be conditioned to different frequencies using frequency modifiers or shifters, whether or not the coherent sources share a common laser source.

Alternatively, the first and second flying spots may be short pulses that are conditioned not to interfere by travelling over different path lengths from a common coherent source, whereby the short pulses of the first and second flying spots do not overlap in time when projected onto the workpiece. In some implementations other methods may be used to suppress interference, e.g. opposite polarisations or fast modulation, such as electro-optical phase-shifting at high-frequency.

In addition to these options, the other features described in more detail above can be combined with these options in any of the combinations described or suggested.

These methods can be implemented in corresponding devices, such as a microlithographic writer that produces a dense brush of interleaved flying spots using optics that have a minimum separation distance among flying spots projected onto a workpiece that makes adjoining coherent beams non-interfering. In one implementation, the writer includes first and second sources of coherent radiation and an optical path that relays the coherent radiation onto a workpiece, forming flying spots. The writer includes at least one brush forming element, such as a diffractive optical element described by Sjöström, in the optical path that separates the coherent radiation into first and second brushes of flying spots of coherent radiation, each with a separation among the flying spots in the respective brushes, when projected onto the workpiece, that is as large as or larger than the minimum separation distance. This writer is characterized by one or more optical combining elements positioned in the optical path to interleave the first and second brushes of flying spots where the distance between individual flying spots in the first brush and individual flying spots in the second brush when projected onto the workpiece is less than the minimum separation distance, and a beam conditioner in the optical path that conditions the first flying spots of coherent radiation to not interfere with the second flying spots of coherent radiation.

Many options are available for enhancing this writer. The following options can be used in any combination, as if they were described by multiply dependent claims depending from other multiply dependent claims.

The writer may include separate lasers or light-emitting diodes as the first and second sources of coherent radiation. The first and second sources of coherent radiation operate at effectively different frequencies. At least one laser or LED used to produce the first and second sources of coherent radiation may be directed through at least one frequency modifier in the optical path that modifies the frequency of one or more of the coherent sources.

In one implementation, the writer uses a pulsed laser to produce the first and second sources of coherent radiation. Two optical paths of different lengths are provided for the first and second sources of coherent radiation. Pulses from the pulsed laser are shorter in length than the difference in length of the two optical paths for the first and second sources of coherent radiation. As a result, the short pulses travelling the two optical paths do not overlap in time when projected onto the workpiece.

In addition to these options, the other features described in more detail above can be combined with these options in any of the combinations described or suggested.

Another method forms a dense brush of interleaved flying spots on a workpiece using a combination of an acousto-optic deflector (AOD) to deflect beams used to produce the flying spots in a first angular direction and a modulator to modulate the power of each beam. This method includes forming a first angular brush of beams going into the AOD by separating and spreading a first source beam into a plurality of first beams, wherein the first beams are spread parallel to a first axis, and forming a second angular brush of beams going into the AOD by separating and spreading a second source beam into a plurality of second beams, wherein the second beams are spread parallel to the first axis. From the first and second angular brushes, a two-dimensional angular brush is formed with an offset between the brushes along a second axis generally perpendicular to the first axis. The method further includes driving the AOD with a chirped RF signal and a varying RF power, wherein the varying RF power controls the average diffraction efficiency of the beams in the AOD, and applying a time-varying modification of the base powers of individual beams in the first and second angular brushes to correct for beam-to-beam differences in diffraction efficiency due to Bragg-angle differences resulting from the angular spread of beams parallel to the first axis.

Several options apply to this and the prior method. The method may further include modulating each of the beams with pattern data and relaying the pattern modulated beams to the workpiece, forming scan lines. Applying this method, there may be a minimum separation distance ("safe distance") between flying spots projected on the workpiece that makes adjacent beams of an angular brush non-interfering. Then, the method may further include separating the beams of the angular brush by more than the safe distance along the first axis and staggering the first and second angular brushes such that the scanned lines on the workpiece are separated by less than the safe distance.

For each of the methods and devices, the modulation of base power and the modulation with raster data can be applied to a beam using the same modulator. For instance, this may be controlled by an electric signal from a digital-to-analog converter (DAC). Modification of the base power and rasterized pattern data can be combined in the digital input to the DAC.

In some implementations, the AOD uses a crystalline interaction medium. An interaction medium may have a circular birefringence and/or an off-axis design. The interaction medium may be tellurium dioxide.

Again, the other features described in more detail above can be combined with these options in any of the combinations described or suggested.

Corresponding to this further method is a microlithographic writer that produces a dense brush of interleaved flying spots on a workpiece, which includes first and second sources of coherent radiation, an optical path that relays the coherent radiation onto a workpiece, forming flying spots, and an acousto-optic deflector (AOD) that deflects beams in a first angular direction. The writer further includes one or more modulators that modulate the power of each beam and at least one brush forming element in the optical path that separates the coherent radiation into first and second angular brushes of flying spots of coherent radiation, wherein the flying spots in each brush are spread parallel to a first axis. It also includes a beam combiner in the optical path that combines the first and second angular brushes with an offset along a second axis generally perpendicular to the first axis. An AOD driving circuit is coupled to the AOD and produces a chirped driving signal and a varying driving power. This varying driving power controls the average diffraction efficiency of the beams in the AOD. The modulators apply a time-varying modification of base powers to individual beams in the first and second angular brushes to correct for beam-to-beam differences in diffraction efficiency due to Bragg-angle differences resulting from the angular spread of beams parallel to the first axis.

Among the options applicable in varying combinations to this writer, the modulators may combine the time-varying modification of the base powers with pattern data.

There may be a minimum separation distance ("safe distance") between flying spots projected on the workpiece that makes adjacent beams of an angular brush non-interfering. The writer may further separate the beams of each angular brush by more than the safe distance along the first axis, and stagger the first and second angular brushes such that the scanned lines on the workpiece are separated by less than the safe distance.

In some implementations, the writer further includes digital-to-analog converters (DACs) coupled to the modulators. The modified base power and rasterized pattern data can be combined in a digital input to the DAC.

In some implementations, the AOD uses a crystalline interaction medium. An interaction medium may have a circular birefringence and/or an off-axis design. The interaction medium may be tellurium dioxide.

Again, the other features described in more detail above can be combined with these options in any of the combinations described or suggested.

Another method of forming a two-dimensional array of flying spots on a workpiece includes projecting a two-dimensional array of coherent beams through a crystal of an acousto-optic deflector (AOD), wherein the coherent beams approach a first surface of the crystal at varying incident angles, producing varying diffraction efficiencies of the coherent beams when swept by the AOD crystal. It further includes modulating the base power of the coherent beams to compensate for the varying diffraction efficiencies, as the coherent beams are swept by the AOD crystal and, optionally, projecting the coherent beams as flying spots onto a workpiece.

The method may further include modulating each of the coherent beams with pattern data and relaying the pattern modulated beams to the workpiece, forming scan lines.

In some implementations, there is a minimum separation distance ("safe distance") between flying spots projected on the workpiece that makes adjacent beams of an angular brush non-interfering. These implementations may further include forming first and second angular brushes of beams in which the flying spots formed by the respective beams of a particular angular brush are separated by more than the safe distance along the first axis, and staggering the first and second angular brushes such that the scanned lines on the workpiece are separated by less than the safe distance.

Additional options and features described for the preceding methods, including those related to the DAC and AOD crystal, apply to this method as well and are incorporated by reference for the sake of brevity.

The corresponding microlithographic writer forms a two-dimensional array of flying spots on a workpiece. It includes an acousto-optic deflector (AOD) including a crystal and an array source that projects a two-dimensional array of coherent beams through the crystal at varying incident angles, producing varying diffraction efficiencies of the coherent beams when swept by the AOD crystal. It further includes a modulator modulating the base power of the coherent beams to compensate for the varying diffraction efficiencies, as the coherent beams are swept by the AOD crystal, and optics that project the coherent beams as flying spots onto a workpiece.

Another method of using an acousto-optic deflector (AOD) and an advanced power equalisation scheme includes applying a variable frequency RF driving power to a transducer coupled to the AOD, wherein the RF driving power decreases as the variable frequency increases, and compensating for lesser diffraction efficiency at higher RF driving frequencies by varying the base power of one or more flying spots deflected by the AOD, wherein the base power increases as the variable frequency increases.

Some implementations include modulating the varying base power of the flying spots with pattern data and relaying the modulated flying spots onto a workpiece. In these implementations, the base power variation and the pattern data modulation may be applied to the flying spots by a single modulator. The single modulator may be a spatial light modulator operating in a diffraction mode or an acousto-optic modulator.

While the present invention is disclosed by reference to the preferred embodiments and examples detailed above, it is understood that these examples are intended in an illustrative rather than in a limiting sense.

We claim as follows:

1. A method of using an acousto-optic deflector (AOD), including:
    applying a variable frequency RF driving power to a transducer coupled to the AOD, wherein the RF driving power decreases as the variable frequency increases; and
    compensating for lesser diffraction efficiency at higher RF driving frequencies by varying base power of one or more flying spots deflected by the AOD onto a workpiece, wherein the base power increases as the variable frequency increases.

2. The method of claim 1, further including modulating the varying base power of the flying spots with pattern data and relaying the modulated flying spots onto a workpiece.

3. The method of claim 2, wherein the base power variation and the pattern data modulation are applied to the flying spots by a single modulator.

4. The method of claim 3, wherein the single modulator is a spatial light modulator operating in a diffraction mode.

5. The method of claim 3, wherein the single modulator is an acousto-optic modulator.

6. A method of improving writing quality in a pattern generator comprising at least one acousto-optic deflector (AOD) by using advanced equalisation, including:
    decreasing the RF power in the driving of the AOD with increasing RF frequency in order to reduce or eliminate the variation of the slope in the power profiles in the AOD, thereby improving writing quality by reducing or essentially eliminating at least one of telecentricity errors, aberrations and varying scan length.

7. The method of claim 6, including the further step of:
    modifying data, in a modulator coupled in series with the AOD, in order to achieve essentially constant beam power over a scan with the AOD, thereby compensating for the varying diffraction efficiency of the AOD caused at least partly from the action of decreasing the RF power in the driving of the AOD as the RF frequency is increased.

* * * * *